(12) United States Patent
Huang et al.

(10) Patent No.: US 11,728,211 B2
(45) Date of Patent: Aug. 15, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Lin-Yu Huang, Hsinchu (TW);
Li-Zhen Yu, New Taipei (TW);
Chia-Hao Chang, Hsinchu (TW);
Cheng-Chi Chuang, New Taipei (TW);
Kuan-Lun Cheng, Hsinchu (TW);
Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/723,427

(22) Filed: Apr. 18, 2022

(65) Prior Publication Data
US 2022/0246464 A1 Aug. 4, 2022

Related U.S. Application Data

(62) Division of application No. 16/944,018, filed on Jul. 30, 2020, now Pat. No. 11,309,212.

(51) Int. Cl.
*H01L 21/768* (2006.01)
*H01L 23/528* (2006.01)
*H01L 23/532* (2006.01)

(52) U.S. Cl.
CPC .... *H01L 21/7682* (2013.01); *H01L 21/76832* (2013.01); *H01L 21/76834* (2013.01);
(Continued)

(58) Field of Classification Search
CPC ............ H01L 23/532; H01L 23/53295; H01L 23/528; H01L 23/53223; H01L 23/53238; H01L 23/53252; H01L 23/53266; H01L 23/5222; H01L 21/768; H01L 21/7682; H01L 21/76832; H01L 21/76834; H01L 21/76883; H01L 21/76847; H01L 21/76877; H01L 21/2815; H01L 21/28132; H01L 21/8234; H01L 21/823468;
(Continued)

(56) References Cited

U.S. PATENT DOCUMENTS

2014/0179102 A1* 6/2014 Jou ................... H10B 12/0335
  438/666
2015/0056801 A1* 2/2015 Park ................... H01L 21/7682
  438/655

* cited by examiner

*Primary Examiner* — Chuong A Luu
(74) *Attorney, Agent, or Firm* — NZ Carr Law Office

(57) ABSTRACT

A semiconductor device structure, along with methods of forming such, are described. The semiconductor device structure includes a device, a first conductive structure disposed over the device, and the first conductive structure includes a first sidewall having a first portion and a second portion. The semiconductor device structure further includes a first spacer layer disposed on the first portion, a second conductive structure disposed adjacent the first conductive structure, and the second conductive structure includes a second sidewall having a third portion and a fourth portion. The semiconductor device structure further includes a second spacer layer disposed on the third portion, and an air gap is formed between the first conductive structure and the second conductive structure. The second portion, the first spacer layer, the fourth portion, and the second spacer layer are exposed to the air gap.

20 Claims, 22 Drawing Sheets

(52) U.S. Cl.
CPC ...... *H01L 21/76883* (2013.01); *H01L 23/528* (2013.01); *H01L 21/76847* (2013.01); *H01L 23/53295* (2013.01)

(58) Field of Classification Search
CPC ......... H01L 21/8238; H01L 21/823864; H01L 29/66; H01L 29/515; H01L 29/4991; H01L 29/6653; H01L 29/66553; H01L 29/6656; H01L 29/66719; H01L 29/4983; H01L 29/51; H01L 29/518; H01L 29/66689; H01L 27/085; H01L 27/098; H01L 27/088; H01L 27/0886; H01L 2221/1042; H01L 2221/1047
USPC ......................................................... 438/638
See application file for complete search history.

SEMICONDUCTOR DEVICE STRUCTURE AND METHODS OF FORMING THE SAME

CROSS-REFERENCE TO RELATED APPLICATIONS

This application is a divisional application of U.S. patent application Ser. No. 16/944,018 filed Jul. 30, 2020, which is incorporated by reference in its entirety.

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-22A are cross-sectional side views of various stages of manufacturing the semiconductor device structure taken along line A-A of FIG. 1, in accordance with some embodiments.

FIGS. 2B-22B are cross-sectional side views of various stages of manufacturing the semiconductor device structure taken along line B-B of FIG. 1, in accordance with some embodiments.

DETAILED DESCRIPTION

Figure 1:
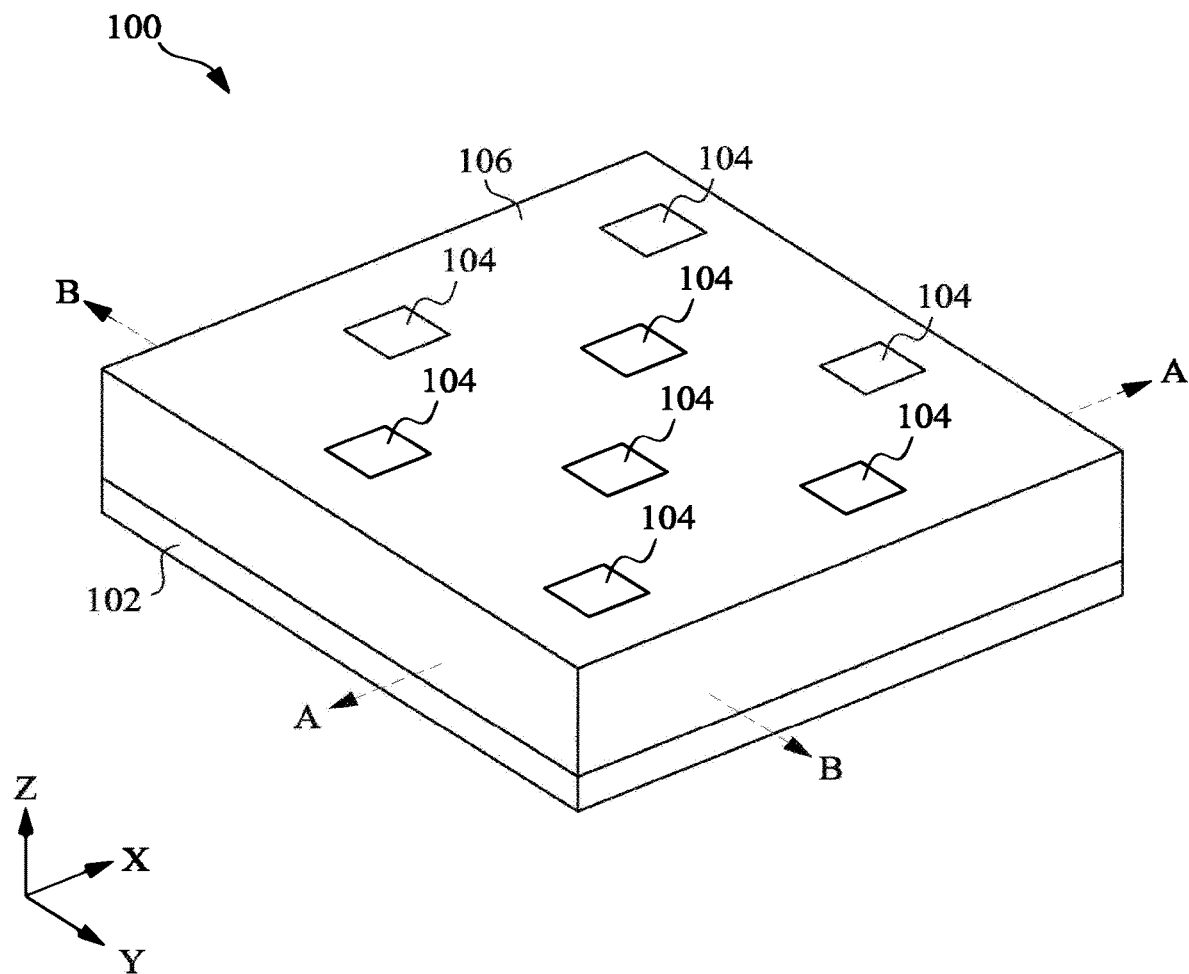
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-18B show exemplary sequential processes for manufacturing a semiconductor device structure 100, in accordance with some embodiments. It is understood that additional operations can be provided before, during, and after processes shown by FIGS. 1-18B, and some of the operations described below can be replaced or eliminated, for additional embodiments of the process. The order of the operations/processes may be interchangeable. FIGS. 19A-22B show alternate sequential processes for manufacturing the semiconductor device structure 100, in accordance with some embodiments. It is understood that additional operations can be provided before, during, and after processes shown by FIGS. 19A-22B, and some of the operations described below can be replaced or eliminated, for additional embodiments of the process. The order of the operations/processes may be interchangeable.

FIG. 1 is a perspective view of one of the various stages of manufacturing a semiconductor device structure 100, in accordance with some embodiments. As shown in FIG. 1, the semiconductor device structure 100 includes a substrate 102 having at least a plurality of conductive features 104 formed thereover. The conductive features 104 are formed in a dielectric material 106. One or more devices, such as transistors, diodes, imaging sensors, resistors, capacitors, inductors, memory cells, a combination thereof, and/or other suitable devices, may be formed between the substrate 102 and the conductive features 104.

Figure 2A:
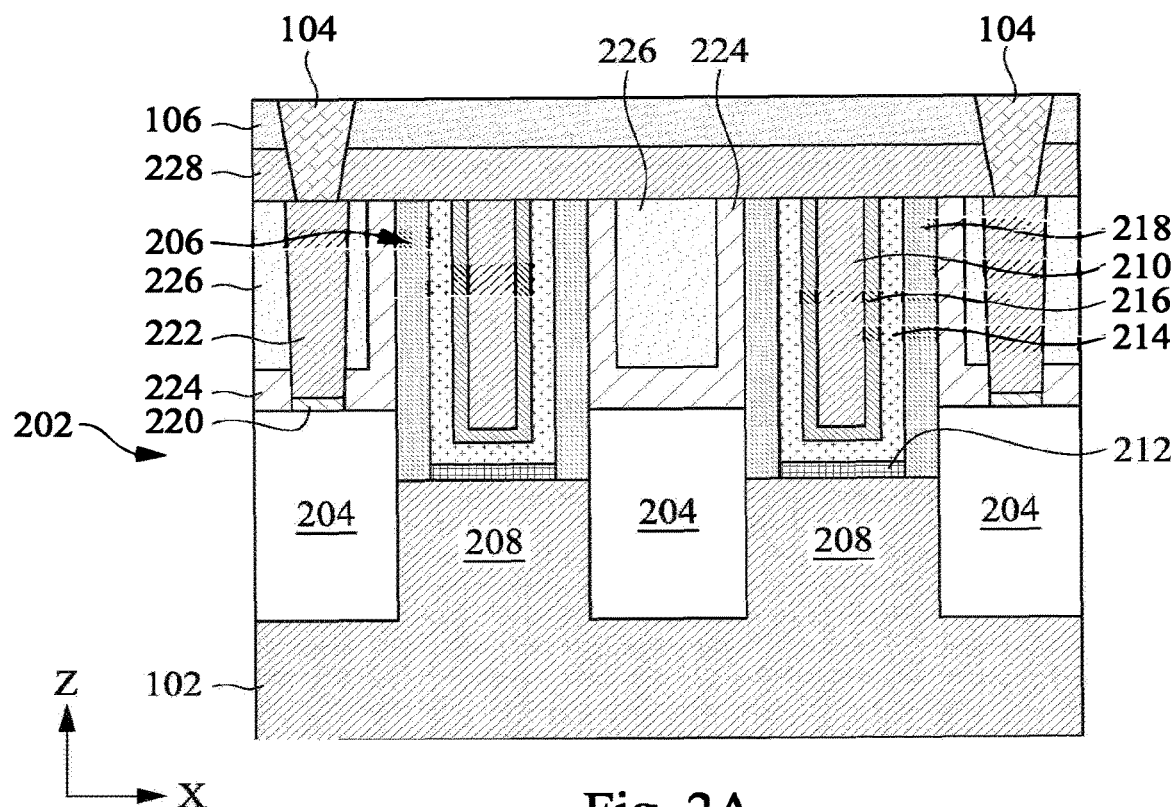
Figure 2B:
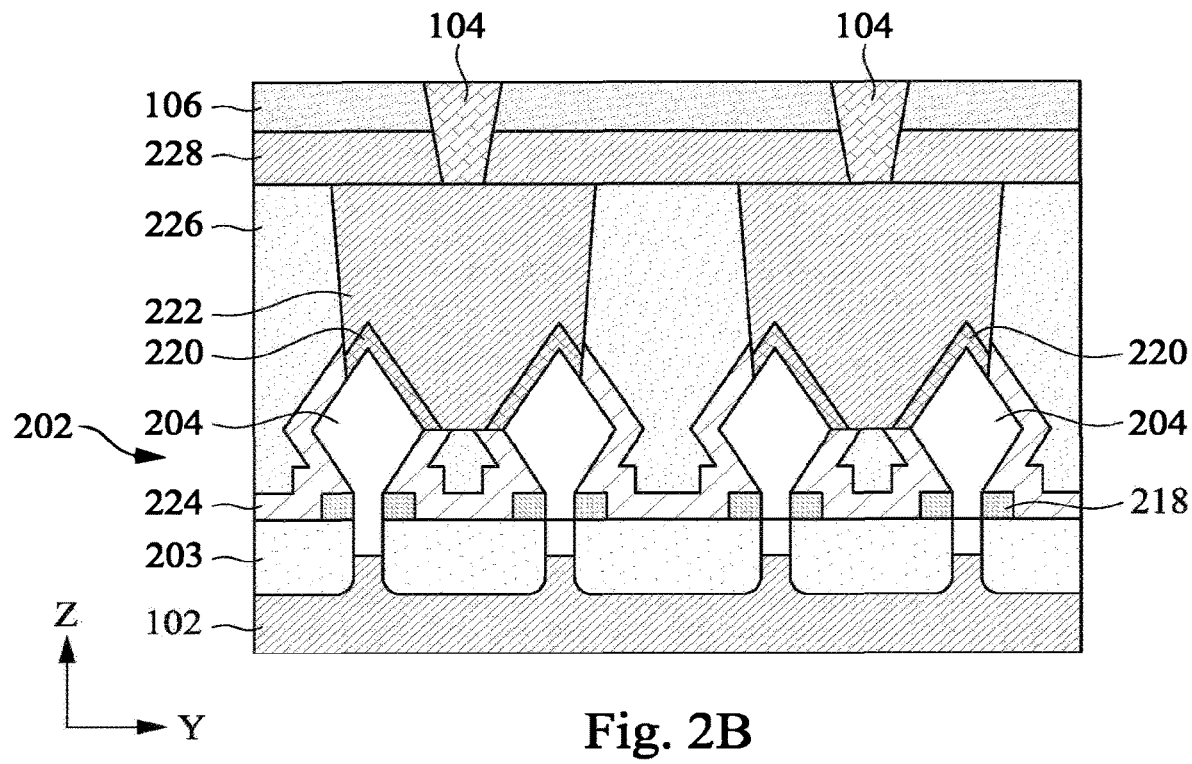

FIGS. 2A-18A are cross-sectional side views of various stages of manufacturing the semiconductor device structure 100 taken along line A-A of FIG. 1, in accordance with some embodiments. FIGS. 2B-18B are cross-sectional side views of various stages of manufacturing the semiconductor device structure 100 taken along line B-B of FIG. 1, in accordance with some embodiments. FIG. 2A is a cross-sectional side view of the semiconductor device structure 100 taken along line A-A of FIG. 1, and FIG. 2B is a cross-sectional side view of the semiconductor device structure 100 taken along line B-B of FIG. 1. The line A-A of FIG. 1 extends along a direction that is substantially perpendicular to the longitudinal direction of a gate stack 206, and the line B-B of FIG. 1 extends along the longitudinal direction of the gate stack 206. As shown in FIGS. 2A and 2B, the semiconductor device structure 100 includes the substrate 102, one or more devices 202 formed on the substrate 102, the dielectric material 106 formed over the devices 202, and the conductive features 104 formed in the dielectric material 106. The substrate 102 may be a semiconductor substrate. In some embodiments, the substrate 102 includes a single crystalline semiconductor layer on at least the surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example boron for an n-type fin field effect transistor (FinFET) and phosphorus for a p-type FinFET.

As described above, the devices 202 may be any suitable devices, such as transistors, diodes, imaging sensors, resistors, capacitors, inductors, memory cells, or a combination thereof. In some embodiments, the devices 202 are transistors, such as planar field effect transistors (FETs), FinFETs, nanosheet transistors, or other suitable transistors. The nanosheet transistors may include nanowire transistors, gate-all-around (GAA) transistors, multi-bridge channel (MBC) transistors, or any transistors having the gate electrode surrounding the channels. An example of the device 202 formed between the substrate 102 and the conductive features 104 is a FinFET, which is shown in FIGS. 2A and 2B. The device 202 includes source/drain (S/D) regions 204 and gate stacks 206. Each gate stack 206 may be disposed between S/D regions 204 serving as source regions and S/D regions 204 serving as drain regions. For example, each gate stack 206 may extend along the Y-axis between a plurality of S/D regions 204 serving as source regions and a plurality of S/D regions 204 serving as drain regions. As shown in FIG. 2A, two gate stacks 206 are formed on the substrate 102. In some embodiments, more than two gate stacks 206 are formed on the substrate 102. Channel regions 208 are formed between S/D regions 204 serving as source regions and S/D regions 204 serving as drain regions.

The S/D regions 204 may include a semiconductor material, such as Si or Ge, a III-V compound semiconductor, a II-VI compound semiconductor, or other suitable semiconductor material. Exemplary S/D regions 204 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 204 may include p-type dopants, such as boron; n-type dopants, such as phosphorus or arsenic; and/or other suitable dopants including combinations thereof. The S/D regions 204 may be formed by an epitaxial growth method using CVD, atomic layer deposition (ALD) or molecular beam epitaxy (MBE). The channel regions 208 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 208 include the same semiconductor material as the substrate 102. In some embodiments, the devices 202 are FinFETs, and the channel regions 208 are located within a plurality of fins disposed below the gate stacks 206. In some embodiments, the devices 202 are nanosheet transistors, and the channel regions 208 are surrounded by the gate stacks 206.

Each gate stack 206 includes a gate electrode layer 210 disposed over the channel region 208 (or surrounding the channel region 208 for nanosheet transistors). The gate electrode layer 210 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 206 may include an interfacial dielectric layer 212, a gate dielectric layer 214 disposed on the interfacial dielectric layer 212, and one or more conformal layers 216 disposed on the gate dielectric layer 214. The gate electrode layer 210 may be disposed on the one or more conformal layers 216. The interfacial dielectric layer 212 may include a dielectric material, such as an oxygen-containing material or a nitrogen-containing material, or multilayers thereof, and may be formed by any suitable deposition method, such as CVD, PECVD, or ALD. The gate dielectric layer 214 may include a dielectric material such as an oxygen-containing material or a nitrogen-containing material, a high-k dielectric material having a k value greater than about 7.0, or multilayers thereof. The gate dielectric layer 214 may be formed by any suitable method, such as CVD, PECVD, or ALD. The one or more conformal layers 216 may include one or more barrier layers and/or capping layers, such as a nitrogen-containing material, for example tantalum nitride (TaN), titanium nitride (TiN), or the like. The one or more conformal layers 216 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 216 may be deposited by ALD, PECVD, MBD, or any suitable deposition technique.

Gate spacers 218 are formed along sidewalls of the gate stacks 206 (e.g., sidewalls of the gate dielectric layers 214). The gate spacers 218 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 206 and the gate spacers 218 may be formed on isolation regions 203. The isolation regions 203 are formed on the substrate 102. The isolation regions 203 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 203 includes silicon oxide that is formed by a FCVD process.

A contact etch stop layer (CESL) 224 is formed on a portion of the S/D regions 204 and the isolation region 203, and a first interlayer dielectric (ILD) 226 is formed on the CESL 224. The CESL 224 can provide a mechanism to stop an etch process when forming openings in the first ILD 226.

The CESL 224 may be conformally deposited on surfaces of the S/D regions 204 and the isolation regions 203. The CESL 224 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The first ILD 226 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 220 is formed on at least a portion of each S/D region 204, as shown in FIGS. 2A and 2B. The silicide layer 220 may include a material having one or more of WSi, CoSi, NiSi, TiSi, MoSi and TaSi. In some embodiments, the silicide layer 220 includes a metal or metal alloy silicide, and the metal includes a noble metal, a refractory metal, a rare earth metal, alloys thereof, or combinations thereof. A conductive contact 222 is disposed on each silicide layer 220. The conductive contact 222 may include a material having one or more of Ru, Mo, Co, Ni. W, Ti, Ta, Cu, Al, TiN or TaN, and the conductive contact 222 may be formed by any suitable method, such as electro-chemical plating (ECP) or PVD. The silicide layer 220 and the conductive contact 222 may be formed by first forming an opening in the first ILD 226 and the CESL 224 to expose at least a portion of the S/D region 204, then forming the silicide layer 220 on the exposed portion of the S/D region 204, and then forming the conductive contact 222 on the silicide layer 220.

An etch stop layer 228 may be formed over the devices 202, as shown in FIGS. 2A and 2B. The etch stop layer 228 may include the same material as the CESL 224 and may be deposited by the same process as that for the CESL 224. The dielectric material 106 is formed on the etch stop layer 228. The dielectric material 106 may be another etch stop layer. The dielectric material 106 may include the same material as the etch stop layer 228 and may be deposited by the same process as that for the etch stop layer 228. The conductive features 104 are formed in the etch stop layer 228 and the dielectric material 106, and each conductive feature 104 may be in contact with a corresponding conductive contact 222.

Figure 3A:
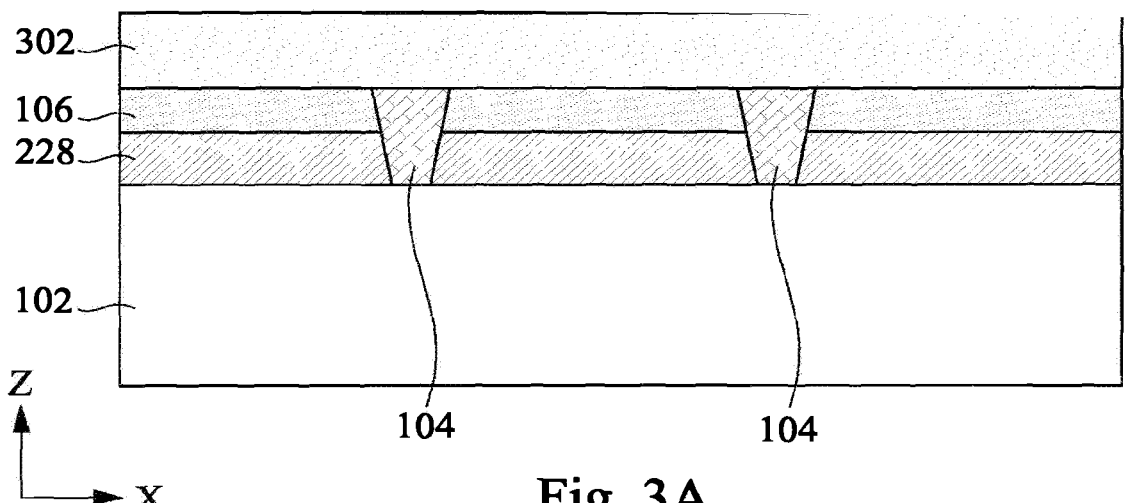
Figure 3B:
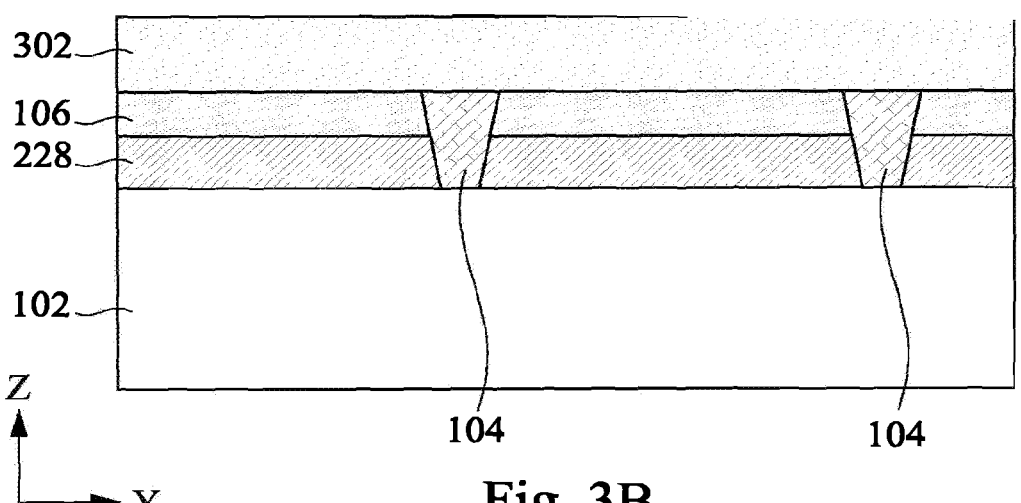

Next, as shown in FIGS. 3A and 3B, a dielectric material 302 is formed on the dielectric material 106 and the plurality of conductive features 104. The devices 202 (FIGS. 2A and 2B) and other features formed on the substrate 102 are omitted for clarity. The dielectric material 302 may be a second ILD. The dielectric material 302 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. In some embodiments, the dielectric material 302 may have a thickness ranging from about 1 nanometer (nm) to about 40 nm. If the thickness of the dielectric material 302 is greater than about 21 nm, the manufacturing cost is increased without significant advantage. On the other hand, if the thickness of the dielectric material 302 is less than about 1 nm, the dielectric material 302 may be insufficient to isolate any conductive features formed therebelow from the conductive features formed thereon. The dielectric material 302 may be formed by any suitable method, such as CVD or PECVD.

Figure 4A:
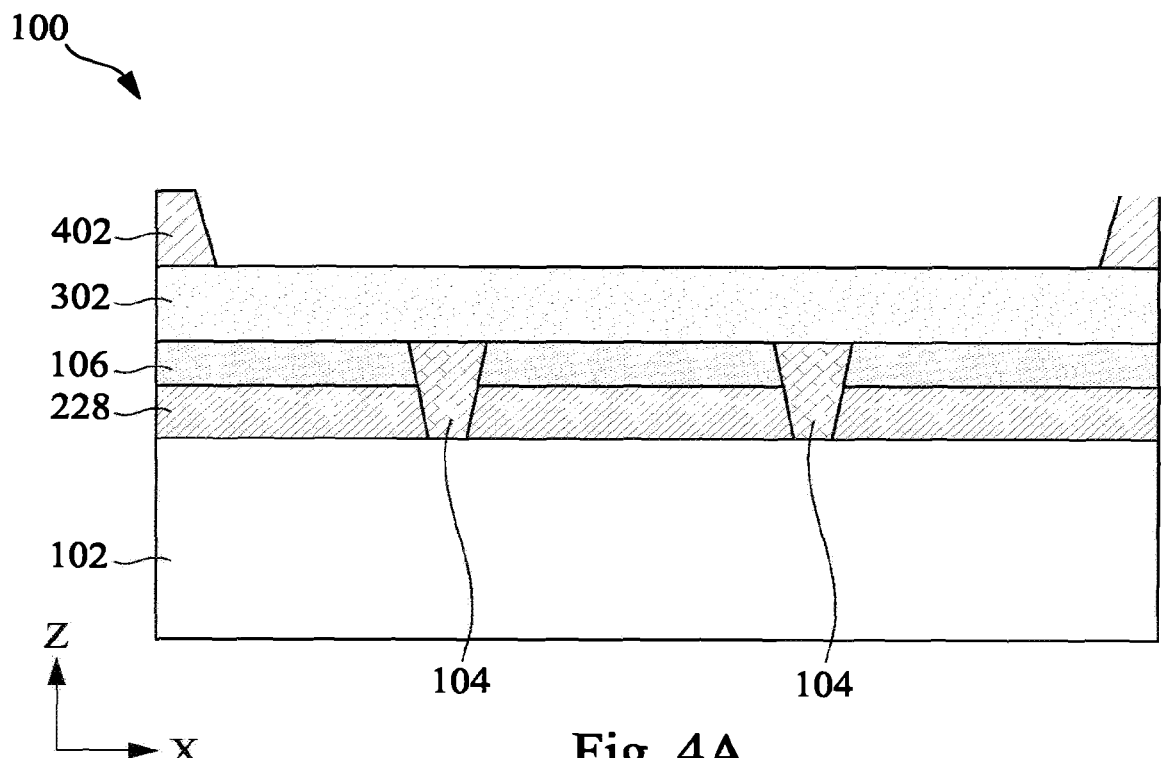
Figure 4B:
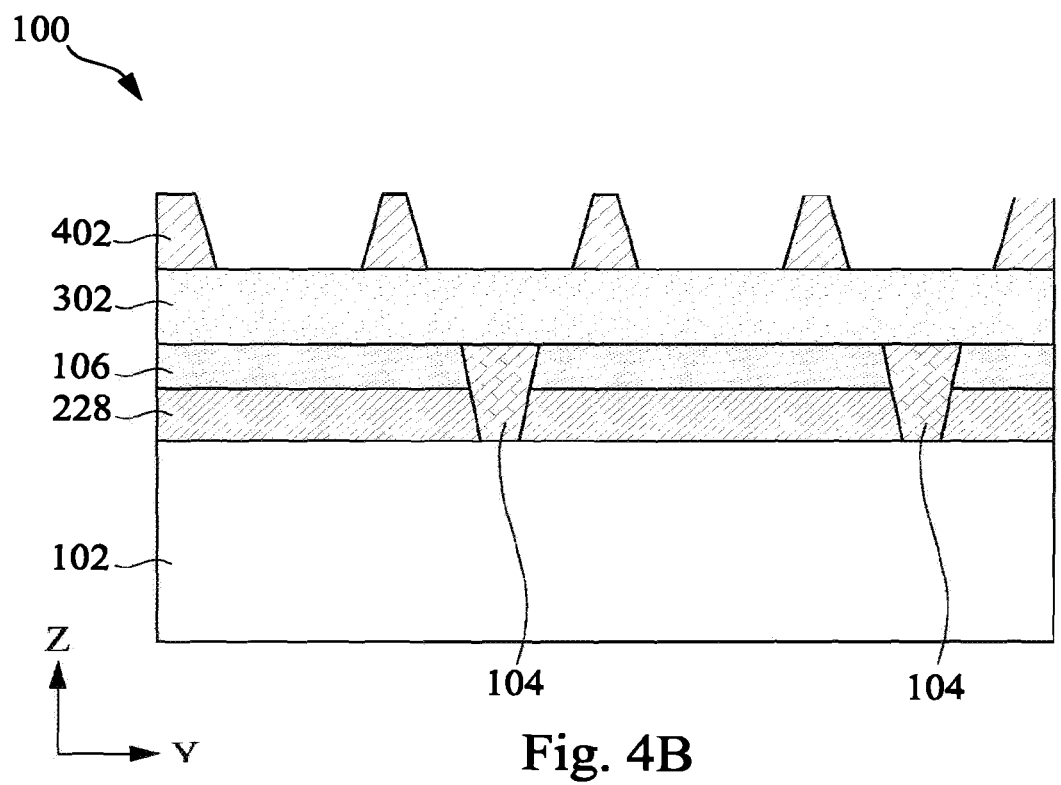

Next, as shown in FIGS. 4A and 4B, a mask layer 402 is formed on portions of the dielectric material 302. The mask layer 402 may be formed by first forming a layer on the dielectric material 302. The layer may include an oxygen-containing material or a nitrogen-containing material, such as a silicon oxide layer, a silicon nitride layer, a silicon oxynitride layer, or combinations thereof. The layer may be patterned and etched to form the mask layer 402. The patterning process may include a photolithography process that may include forming a photoresist layer (not shown) over the layer, exposing the resist to a pattern, performing post-exposure bake processes, and developing the resist. In some embodiments, patterning the resist may be performed using an acceptable lithography process, such as an electron beam (e-beam) lithography process, an extreme ultraviolet lithography process, or the like. The pattern of the resist is transferred to the layer using one or more etching processes to form the mask layer 402. In some embodiments, the etching process may include dry etching (e.g., reactive ion etching (RIE)), wet etching, other etching methods, and/or combinations thereof.

Figure 5A:
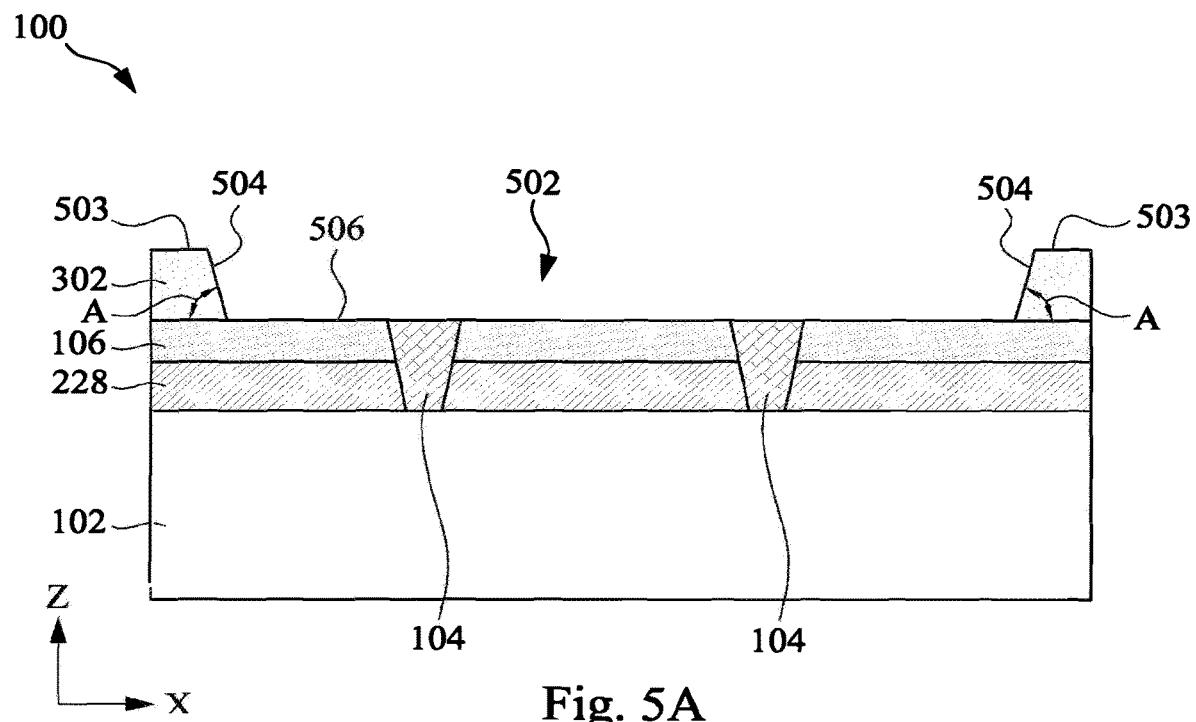
Figure 5B:
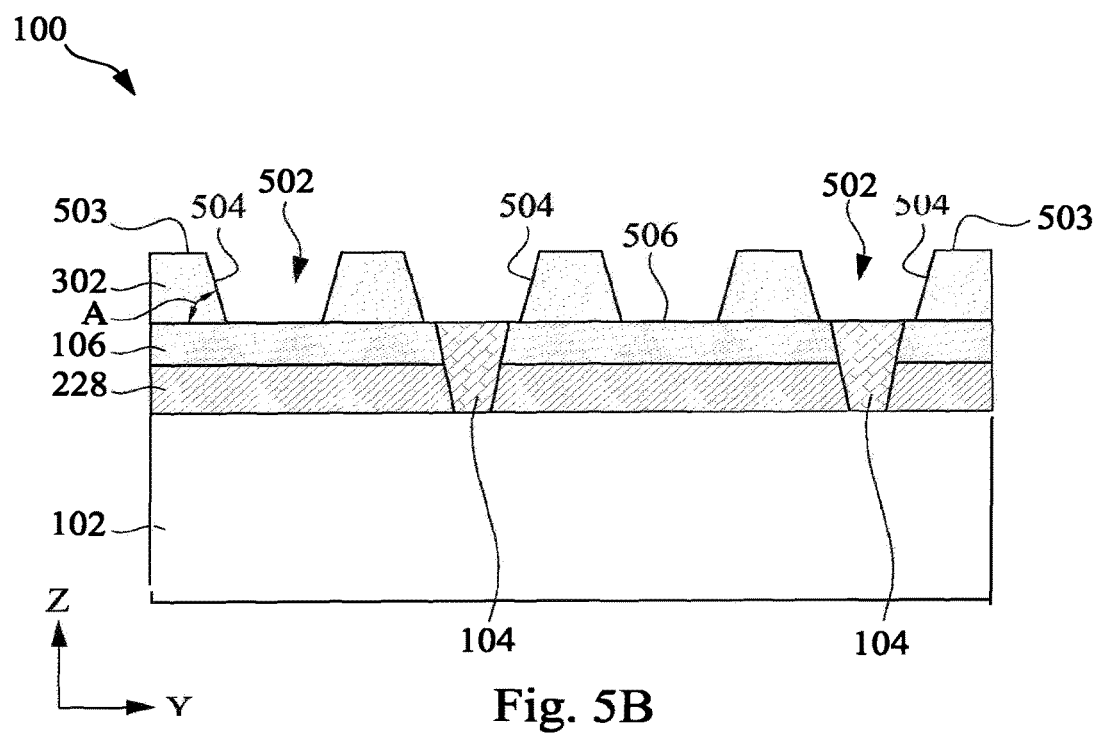

The pattern of the mask layer 402 is transferred to the dielectric material 302 by removing portions of the dielectric material 302 not covered by the mask layer 402, as shown in FIGS. 5A and 5B. The removal of portions of the dielectric material 302 may be performed by any suitable method, such as dry etching, wet etching, or a combination thereof. The mask layer 402 is then removed. The remaining dielectric material 302 has a top surface 503 and sidewalls 504. Openings 502 are formed as the result of the removal of the portions of the dielectric material 302. Each opening 502 may be defined by the corresponding sidewall 504. In some embodiments, openings 502 are trenches, and the sidewall 504 defining each trench includes multiple surfaces, such as 4 surfaces, as shown in FIGS. 5A and 5B. In some embodiments, openings 502 are vias, and the sidewall 504 defining each via is a continuous surface. The sidewall 504 may form an acute angle A with respect to a top surface 506 of the dielectric material 106 as a result of the etching process. The acute angle A may range from about 60 degrees to about 89.5 degrees. In the embodiment where the sidewall 504 includes multiple surfaces, each surface may form the acute angle A with respect to the top surface 506 of the dielectric material 106, the acute angles A of the surfaces of the sidewall 504 may be substantially the same or different.

As shown in FIGS. 5A and 5B, the openings 502 expose the conductive features 104 and portions of the top surface 506 of the dielectric material 106. In some embodiments, when the conductive features 104 are not present in the etch stop layer 228 and the dielectric material 106, portions of the dielectric material 106 and the etch stop layer 228 not covered by the dielectric material 302 are removed to expose the conductive contacts 222 and portions of the first ILD 226 (FIGS. 2A and 2B). The removal of the portions of the dielectric material 106 and the etch stop layer 228 may be performed by the same process as the removal of the portion of the dielectric material 302 or by a separate process as the removal of the portion of the dielectric material 302. As shown in FIG. 5A, 2 conductive features 104 are exposed along the X-axis. In some embodiments, more than 2 conductive features 104, such as more than 5 or more than 10 conductive features 104 are exposed. In the embodiment where the conductive features 104 are not present, more than 2 conductive contacts 222 (FIGS. 2A and 2B), such as more than 5 or more than 10 conductive contacts 222, are exposed.

Figure 6A:
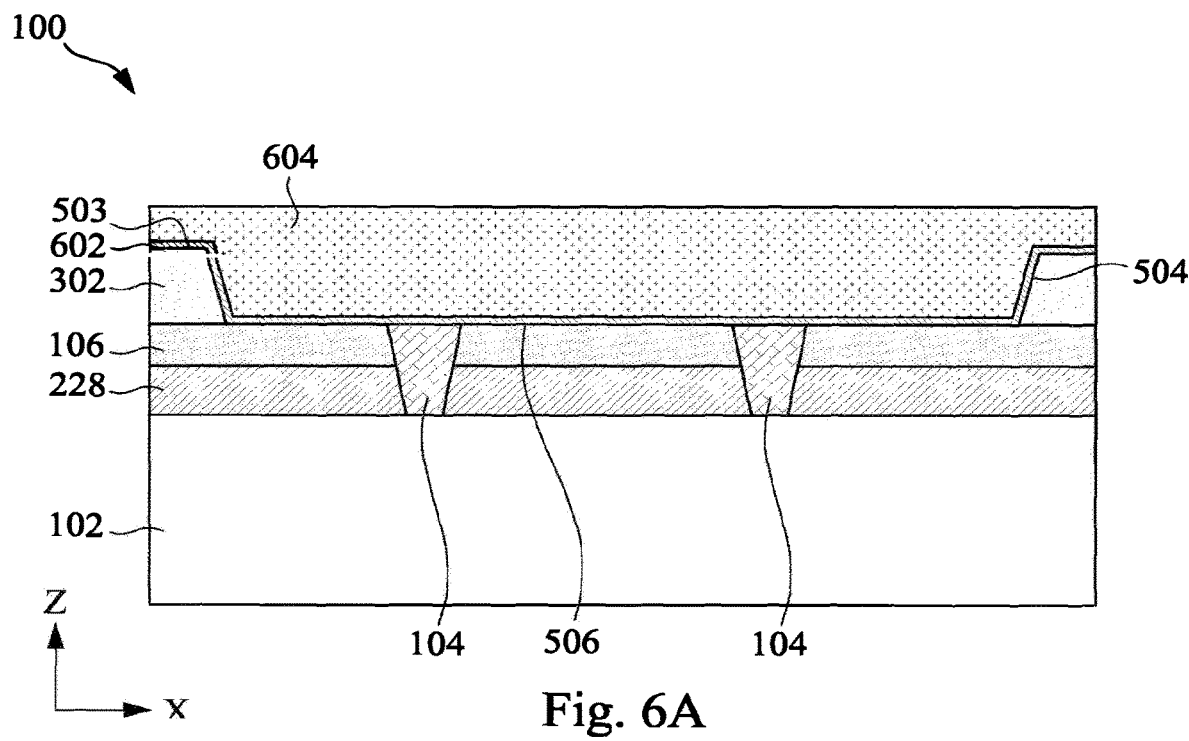
Figure 6B:
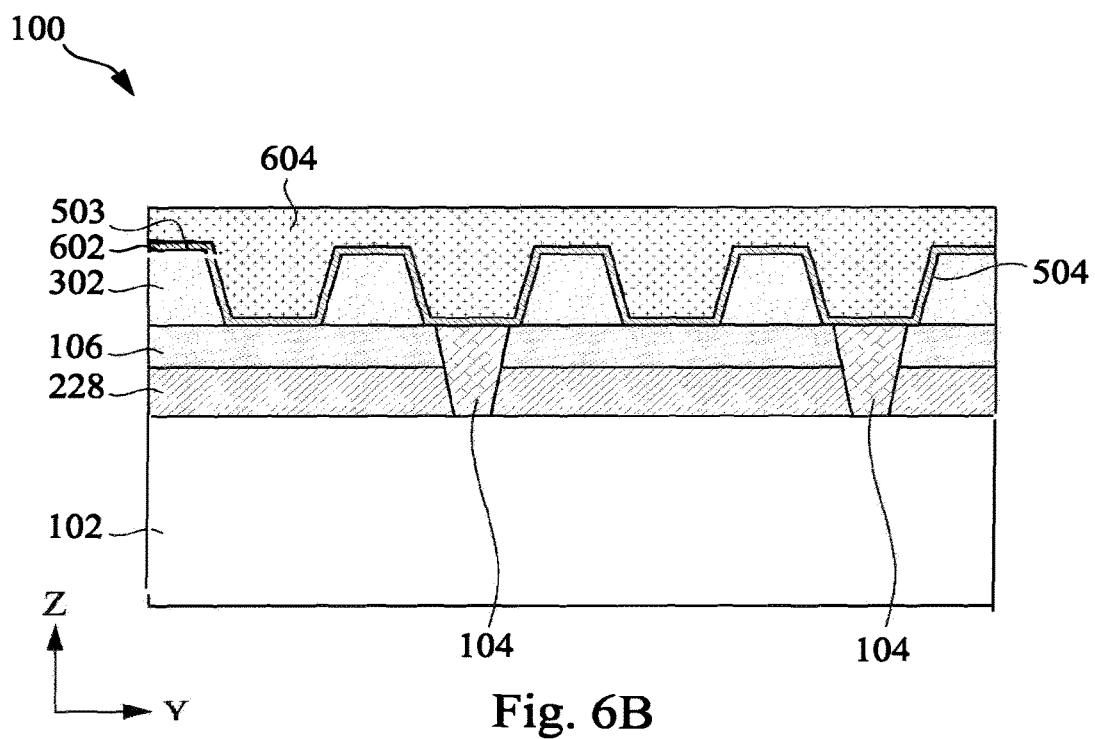

A first barrier layer 602 is formed on the top surfaces 503 of the dielectric material 302, the sidewalls 504 of the dielectric material 302, the exposed portions of the top surface 506 of the dielectric material 106, and the conductive features 104, as shown in FIGS. 6A and 6B. The first barrier layer 602 may include Co, W, Ru, Al, Mo, Ti, TiN, TiSi, CoSi, NiSi, Cu, TaN, Ni, or TiSiNi. The first barrier layer 602 may be a single layer or a multilayer structure, such as a two-layer structure or a three-layer structure. In some embodiments, the first barrier layer 602 may be conformally deposited and may have a thickness ranging from about 0.5 nm to about 10 nm. The first barrier layer 602 functions as a diffusion barrier layer to prevent a first conductive material 604 from diffusing into the dielectric material 106 and the dielectric material 302. Thus, if the thickness of the first barrier layer 602 is less than about 0.5 nm, the first barrier layer 602 may not be sufficient to prevent the diffusion of the first conductive material 604 into the dielectric material 106 and the dielectric material 302. On the other hand, if the thickness of the first barrier layer 602 is greater than about 10 nm, the manufacturing cost is increased without significant advantage. The first barrier layer 602 may be formed by any suitable method, such as ALD, CVD or PECVD.

The first conductive material 604 is formed on the first barrier layer 602, as shown in FIGS. 6A and 6B. The first conductive material 604 may include Co, W, Ru, Al, Mo, Ti, TiN, TiSi, CoSi, NiSi, Cu, TaN, Ni, or TiSiNi. The first conductive material 604 may include the same or different material as the first barrier layer 602. In some embodiments, the first barrier layer 602 is not present, and the first conductive material 604 is formed on the top surface 503 of the dielectric material 302, the sidewalls 504 of the dielectric material 302, the exposed portions of the top surface 506 of the dielectric material 106, and the conductive features 104.

Figure 7A:
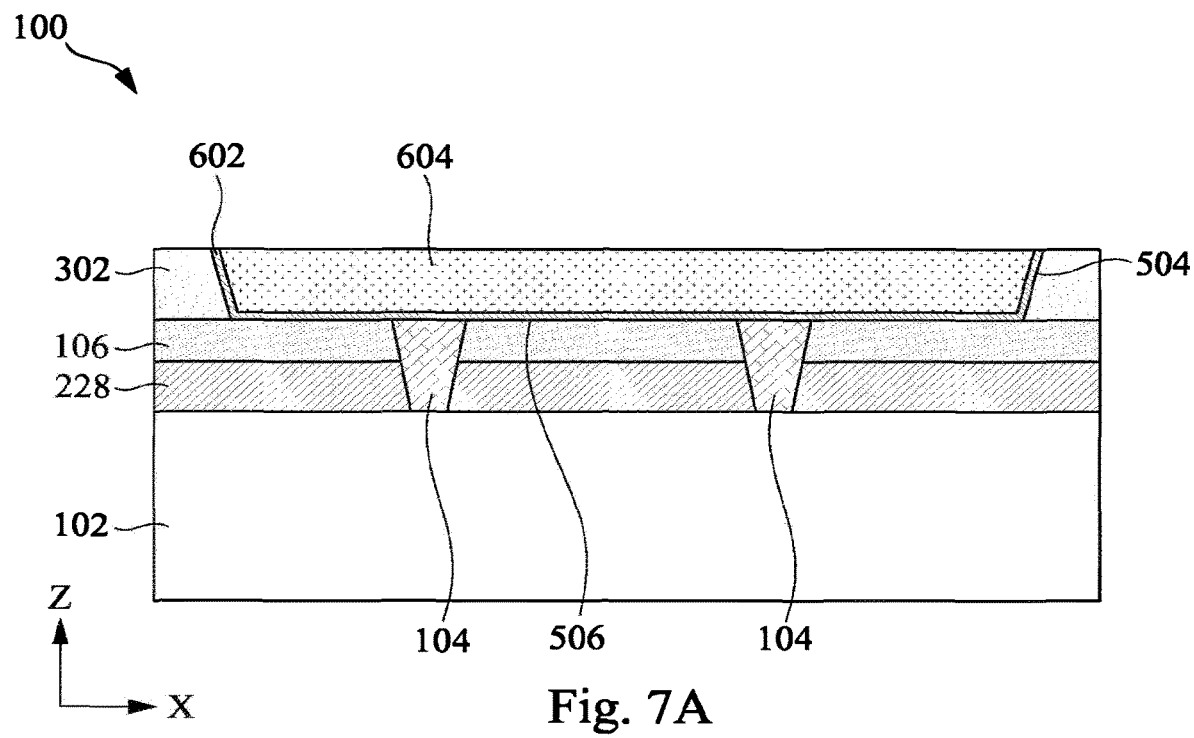
Figure 7B:
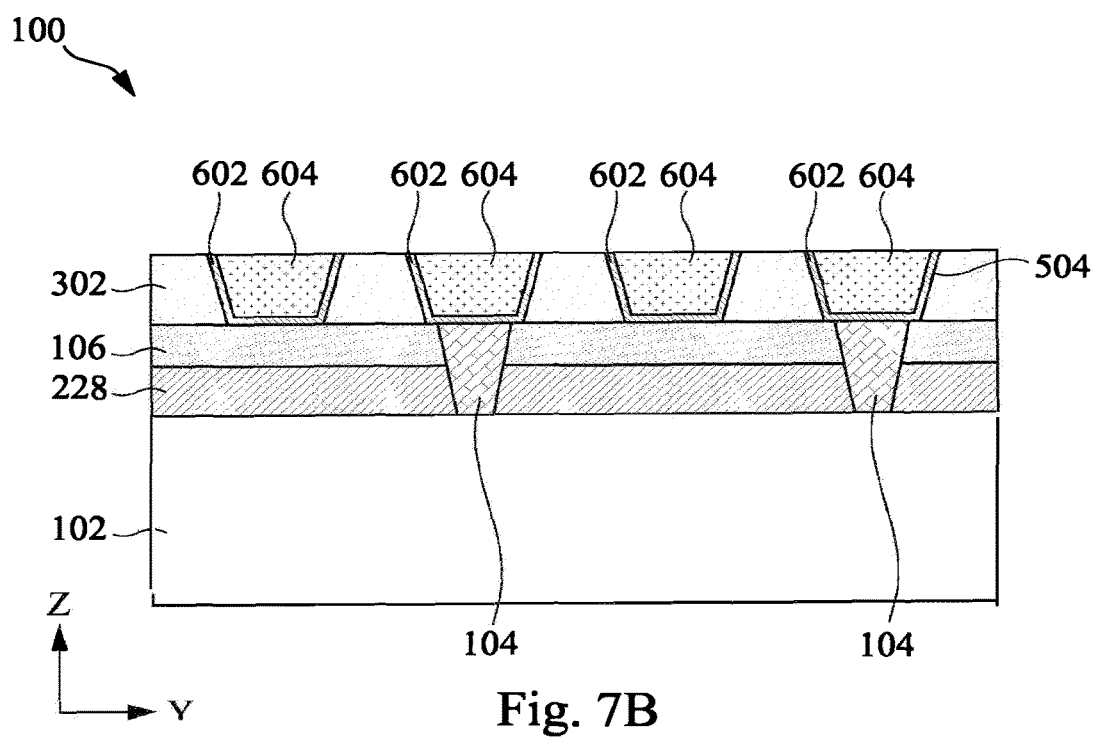

Next, as shown in FIGS. 7A and 7B, a planarization process is performed to expose the dielectric material 302. The planarization process may be any suitable process, such as a chemical mechanical polishing (CMP) process. The planarization process removes portions of the first conductive material 604 and portions of the first barrier layer 602 so the first conductive material 604 is substantially coplanar with the dielectric material 302.

Figure 8A:
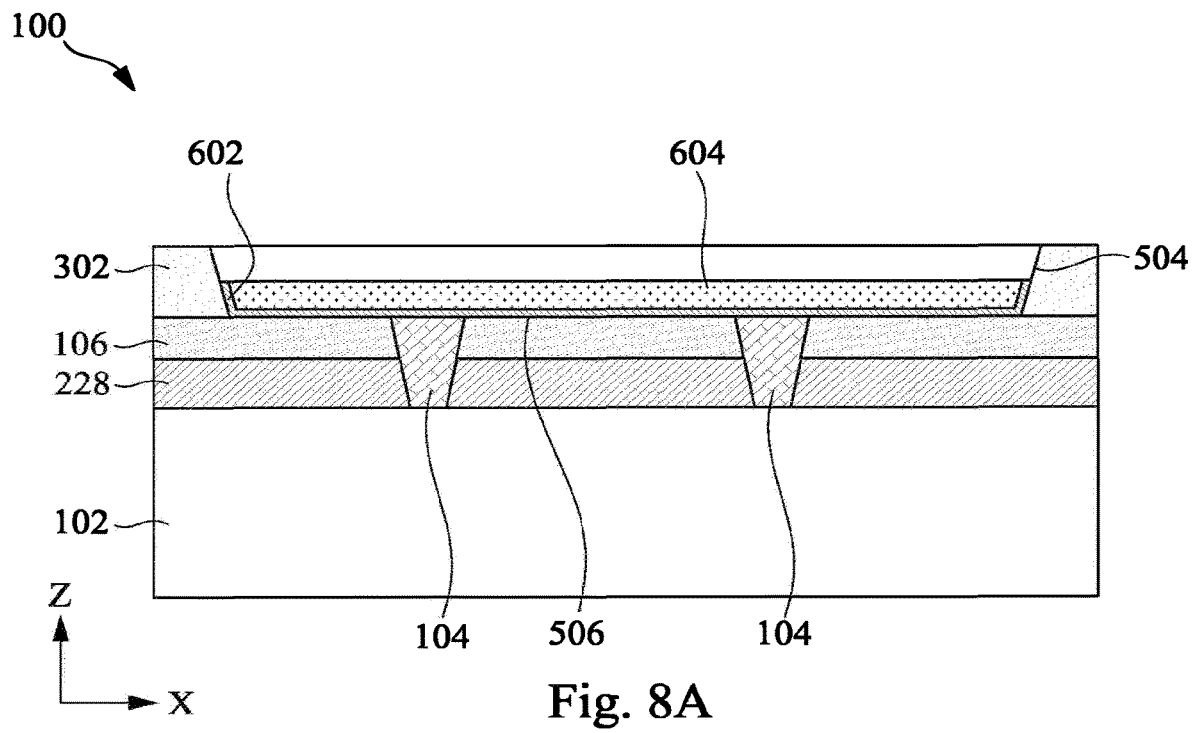
Figure 8B:
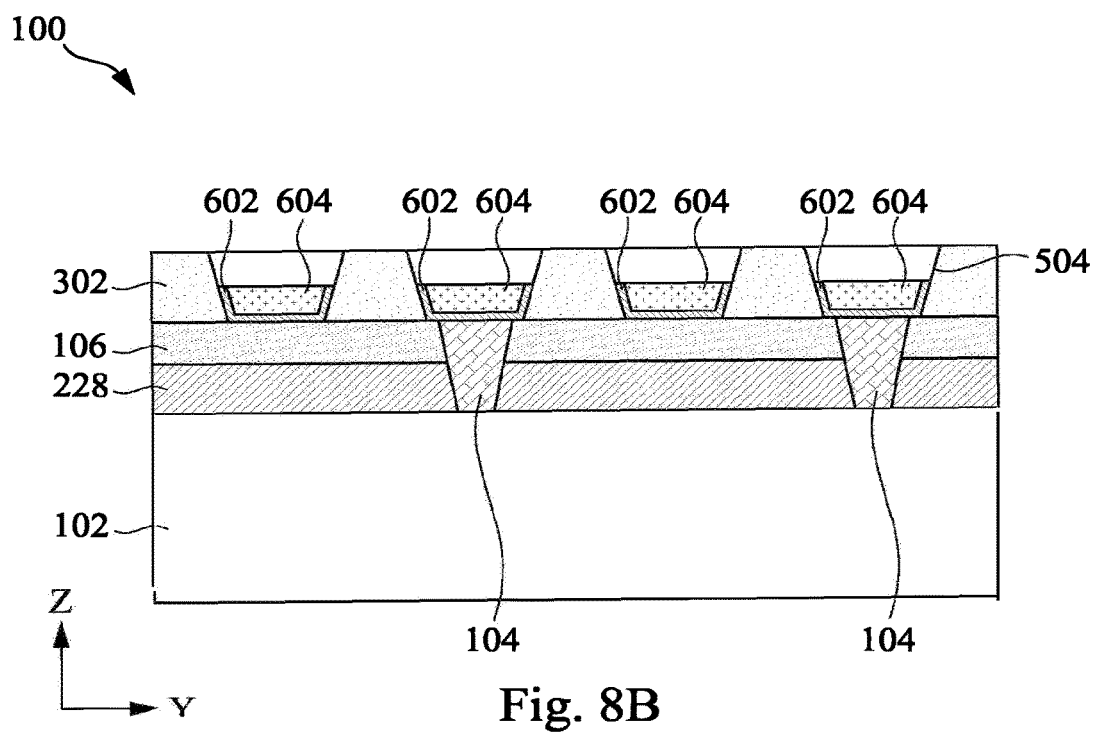

In some embodiments, the first barrier layer 602 and the first conductive material 604 are etched back, as shown in FIGS. 8A and 8B. Portions of the first barrier layer 602 disposed on the sidewall 504 are removed to expose a portion of the sidewall 504. The thickness of the first conductive material 604 is reduced, so the openings 502 are partially filled. The etch back of the first barrier layer 602 and the first conductive material 604 may be performed by any suitable method, such as dry etching, wet etching, or a combination thereof. In some embodiments, a selective dry etching process is utilized to perform the etch back. The selective dry etching process selectively removes portions of the first barrier layer 602 and the first conductive material 604, while the dielectric material 302 is not removed.

Figure 9A:
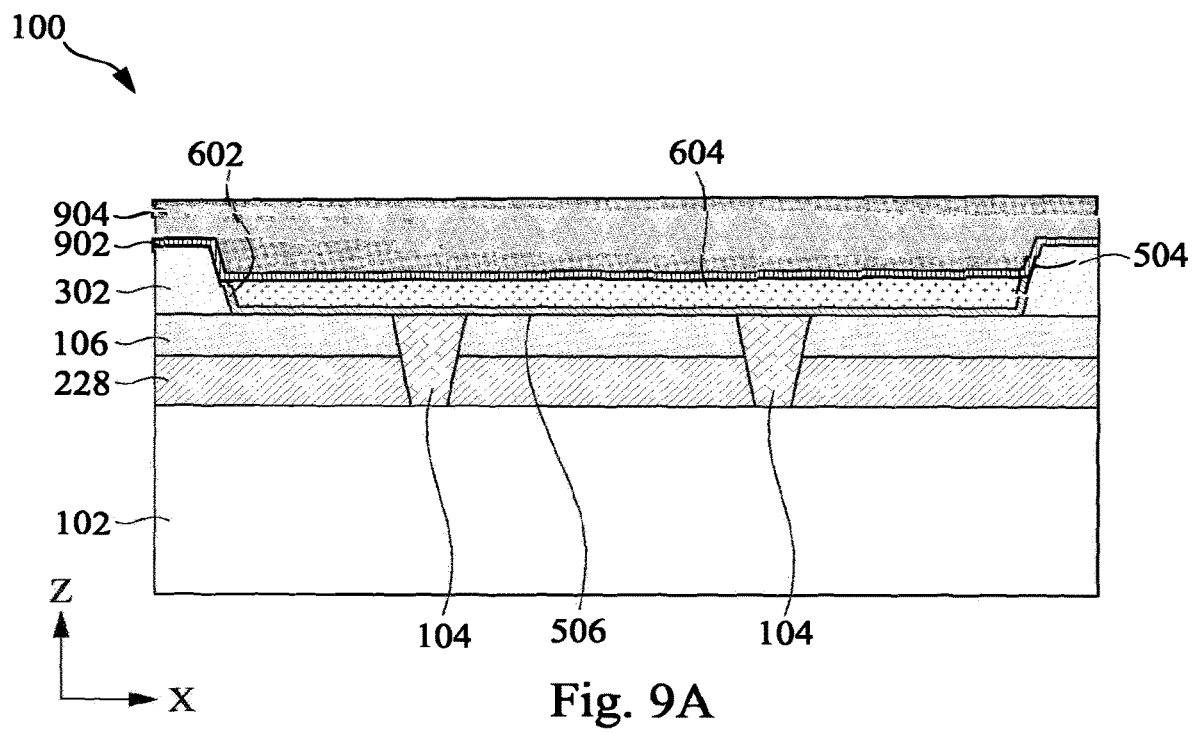
Figure 9B:
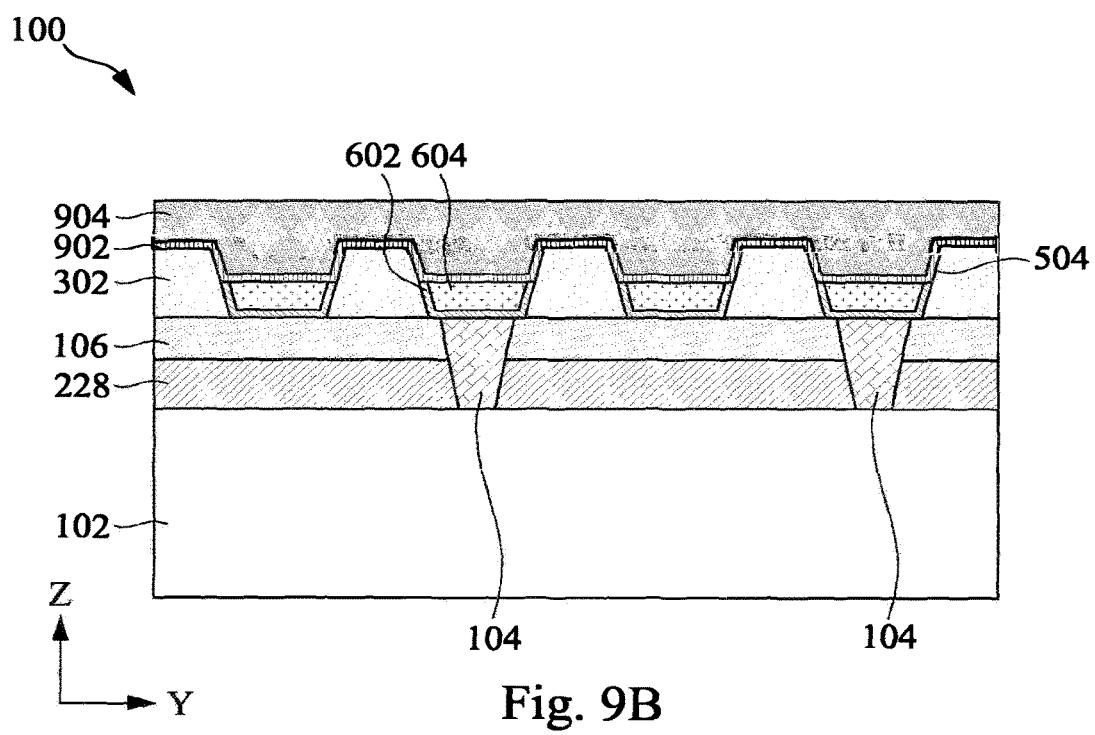

Next, as shown in FIGS. 9A and 9B, a second barrier layer 902 is formed on the dielectric material 302, the exposed portion of the sidewall 504, the first barrier layer 602, and the first conductive material 604. The second barrier layer 902 may include Co, W, Ru, Al, Mo, Ti, TiN, TiSi, CoSi, NiSi, Cu, TaN, Ni, or TiSiNi. The second barrier layer 902 may be a single layer or a multilayer structure, such as a two-layer structure or a three-layer structure. In some embodiments, the second barrier layer 902 may be conformally deposited and may have a thickness ranging from about 0.5 nm to about 10 nm. The second barrier layer 902 functions as a diffusion barrier layer to prevent a second conductive material 904 from diffusing into the dielectric material 302. Thus, if the thickness of the second barrier layer 902 is less than about 0.5 nm, the second barrier layer 902 may not be sufficient to prevent the diffusion of the conductive material 904 into the dielectric material 302. On the other hand, if the thickness of the second barrier layer 902 is greater than about 10 nm, the manufacturing cost is increased without significant advantage. The second barrier layer 902 may be formed by any suitable method, such as ALD, CVD or PECVD.

The second conductive material 904 is formed on the second barrier layer 902, as shown in FIGS. 9A and 9B. The second conductive material 904 may include Co, W, Ru, Al, Mo, Ti, TiN, TiSi, CoSi, NiSi, Cu, TaN, Ni, or TiSiNi. The second conductive material 904 may include the same or different material as the second barrier layer 902. In some embodiments, the second barrier layer 902 is not present, and the second conductive material 904 is formed on the dielectric material 302, the exposed portion of the sidewall 504, the first barrier layer 602, and the first conductive material 604.

In some embodiments, the first conductive material 604 is a metal having a low electrical resistivity, such as copper, and the first conductive material 604 fills the openings 502 without the second conductive material 904 (the second conductive material 904 and the second barrier layer 902 are not present). However, as the dimensions of features get smaller, materials such as copper may not have good step coverage in the openings 502. Thus, in some embodiments, a conductive material having good step coverage in the openings 502 may be utilized as the first conductive material 604, and a conductive material having low electrical resistivity may be utilized as the second conductive material 904. The bottom of the opening 502 has a smaller dimension than the top of the opening 502, thus, the first conductive material 604 having good step coverage is formed at the bottom of the opening 502 and the second conductive material 904 having low electrical resistivity is formed at the top of the opening 502. For example, the first conductive material 604 is TiN and the second conductive material 904 is Cu. In some embodiments, the thickness of the first conductive material 604 ranges from about 0.5 nm to about 40 nm, and the thickness of the second conductive material 904 ranges from about 0.5 nm to about 38 nm. In some embodiments, the second conductive material 904 does not exist, and the thickness of the first conductive material 604 ranges from about 0.5 nm to about 40 nm. The thicknesses of the first conductive material 604 and the second conductive material 904 may be defined by the thickness of the dielectric material 302.

Figure 10A:
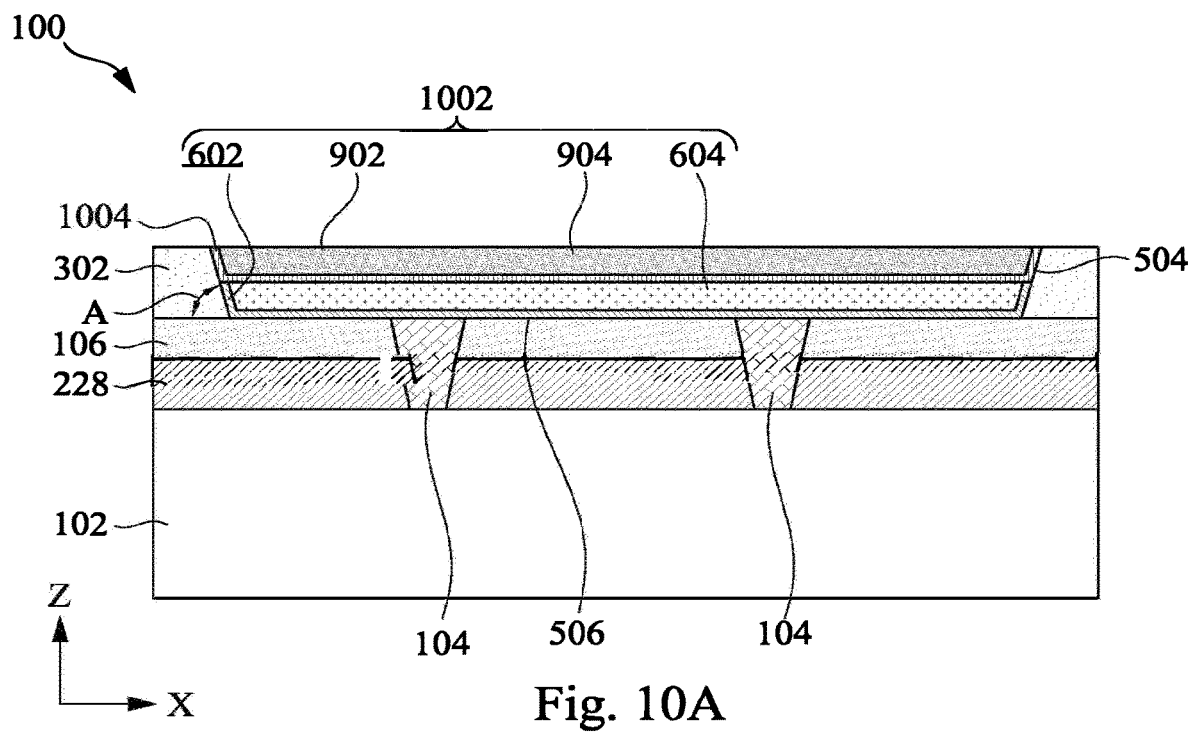
Figure 10B:
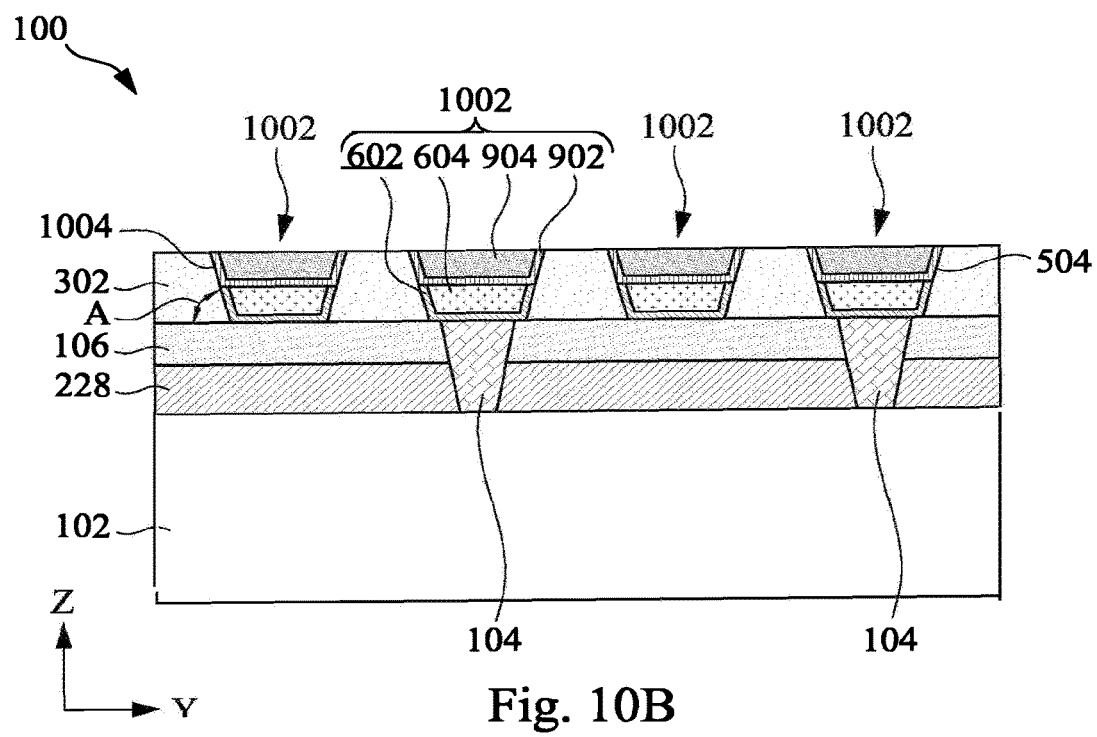

Next, as shown in FIGS. 10A and 10B, a planarization process is performed to expose the dielectric material 302. The planarization process may be any suitable process, such as a CMP process. The planarization process removes portions of the second conductive material 904 and portions of the second barrier layer 902 so the second conductive material 904 is substantially coplanar with the dielectric material 302. The first barrier layer 602, the first conductive material 604, the second barrier layer 902, and the second conductive material 904 may be collectively referred to as a conductive structure 1002. The conductive structure 1002 may be a conductive contact, a conductive line, or a conductive via. In some embodiments, the conductive structure 1002 includes the first conductive material 604 and optionally the first barrier layer 602, while the second barrier layer 902 and the second conductive material 904 are not present. The conductive structure 1002 includes a sidewall 1004 in contact with the sidewall 504 of the dielectric material 302. Because the sidewall 1004 is in contact with the sidewall 504 of the dielectric material 302, the sidewall 1004 also forms the acute angel A with respect to the top surface 506 of the dielectric material 106. The sidewall 1004 of the conductive structure 1002 may include one or more of the first barrier layer 602, first conductive material 604, second barrier layer 902, and second conductive material 904. For example, in some embodiments, the sidewall 1004 includes the first barrier layer 602 and the second barrier layer 902, as shown in FIGS. 10A and 10B. The sidewall 1004 of the conductive structure 1002 may include multiple surfaces or a continuous surface, based on the shape of the conductive structure 1002. In some embodiments, the conductive structure 1002 is a conductive line, and the sidewall 1004 of the conductive line includes multiple surfaces, such as 4 surfaces, as shown in FIGS. 10A and 10B. In some embodiments, the conductive structure 1002 is a conductive via, and the sidewall 1004 of the conductive via is a continuous surface. The conductive structure 1002 may have a first width extending along the Y-axis ranging from about 3 nm to about 15 nm at the top and a second width extending along the Y-axis ranging from about 3 nm to about 15 nm at the bottom. In some embodiments, the first width is greater than the second width.

Figure 11A:
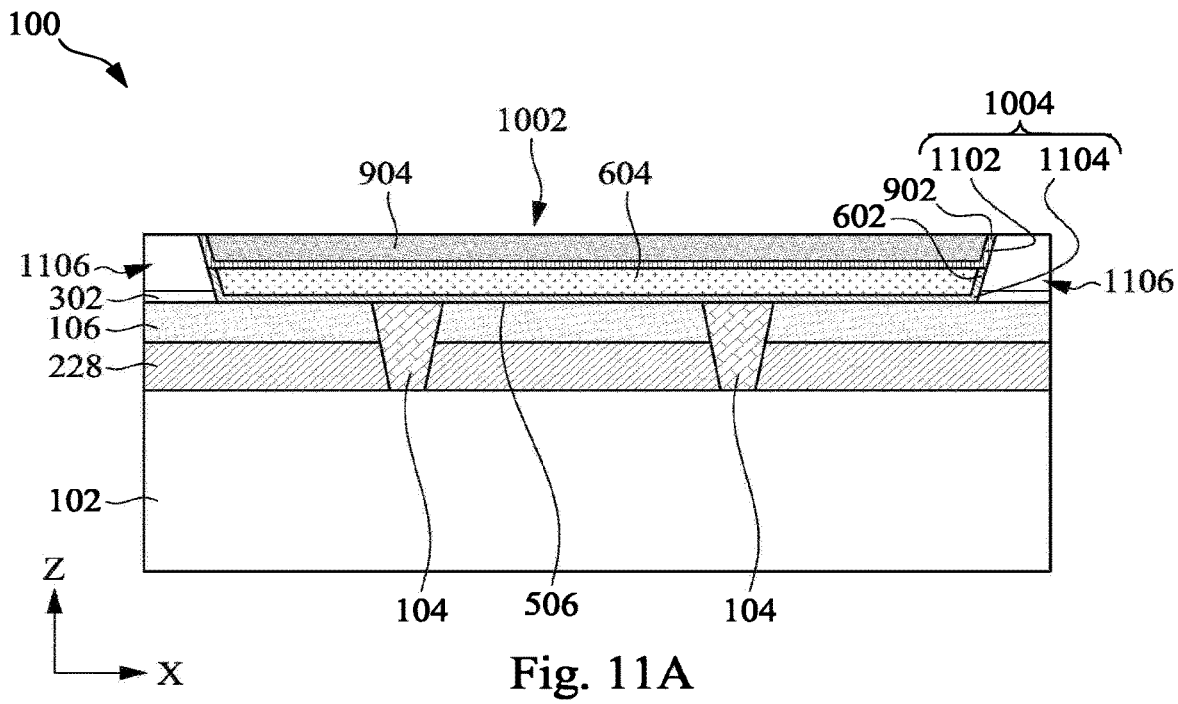
Figure 11B:
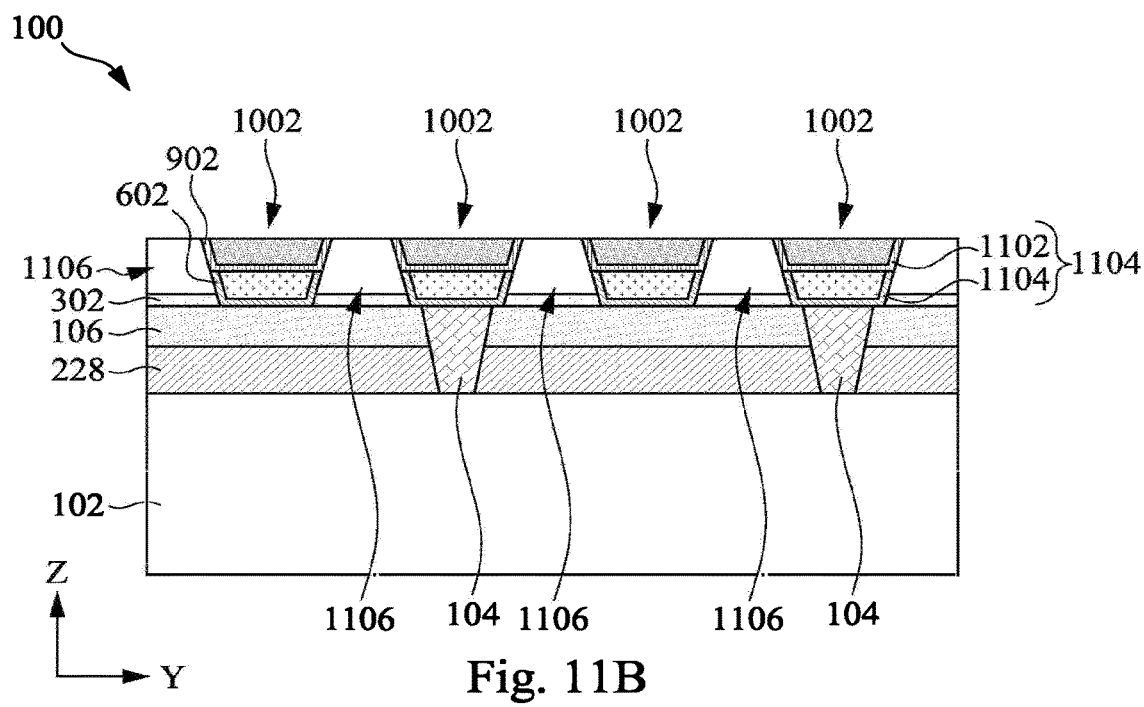
Figure 20A:
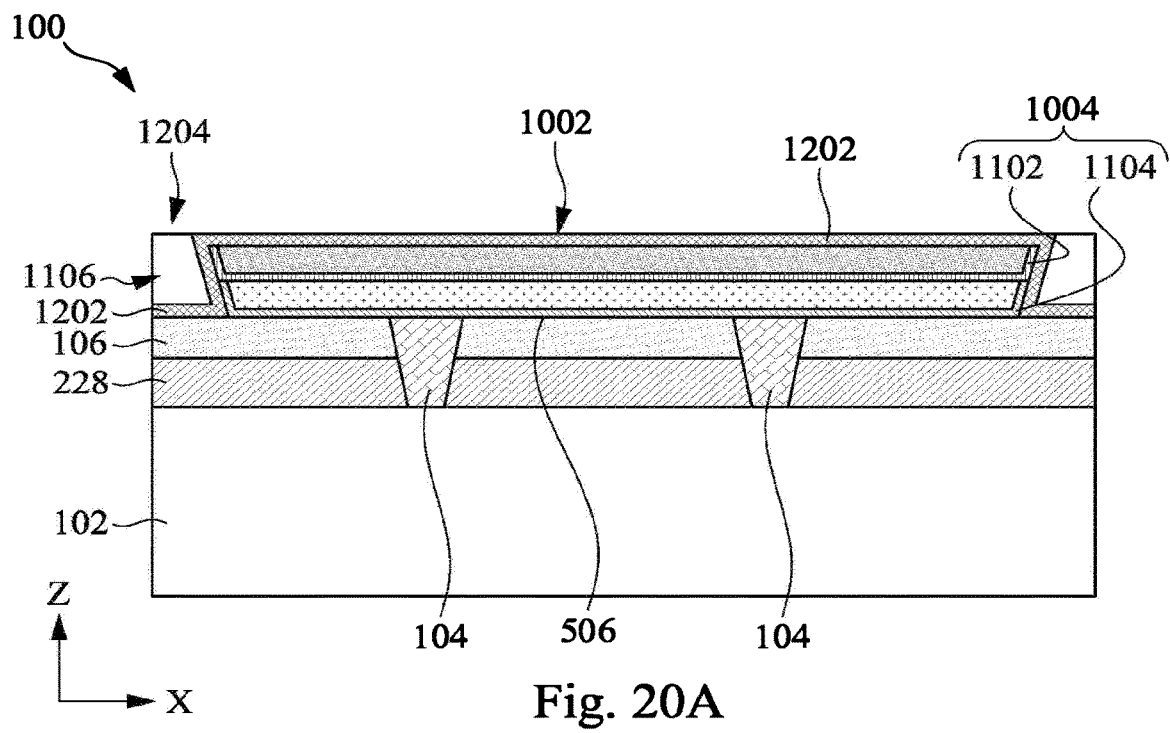
Figure 20B:
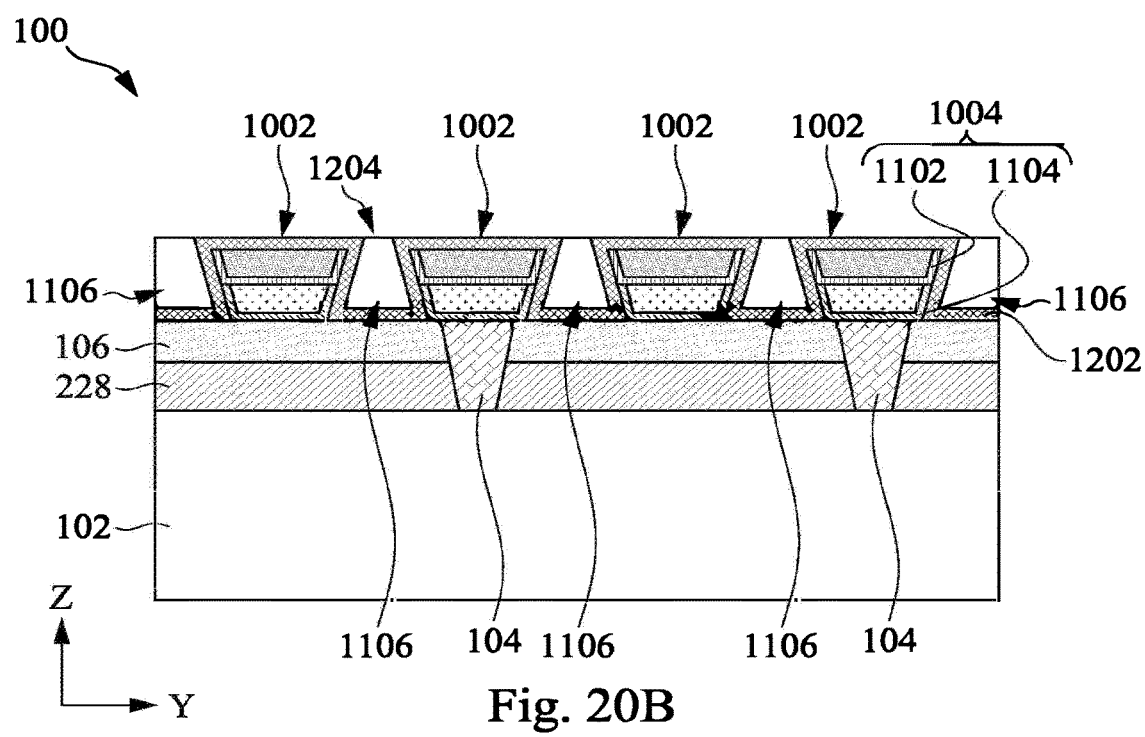

In some embodiments, the dielectric material 302 is etched back to form air gaps 1106 between neighboring conductive structures 1002, as shown in FIGS. 11A and 11B. The thickness of the dielectric material 302 is reduced to a range from about 0.5 nm to about 20 nm, and a first portion 1102 of the sidewall 1004 of the conductive structure 1002 is exposed. The thickness of the dielectric material 302 is reduced, so a spacer layer 1202 (FIGS. 12A and 12B) may be conformally formed on the dielectric material 302 with the reduced thickness and on the sidewall 1004 of the conductive structure 1002. Thus, if the thickness of the dielectric material 302 is greater than about 20 nm, the portion of the spacer layer 1202 (FIGS. 12A and 12B) disposed on the dielectric material 302 and the portion of the spacer layer 1202 (FIGS. 12A and 12B) disposed on the sidewall 1004 of the conductive structure 1002 may not provide enough room for the air gap 1106, leading to small openings 1204 (FIGS. 12A and 12B) of the air gaps 1106. As a result, the dimensions of the air gap 1106 may be too small to achieve any device performance gain. In some embodiments, as shown in FIGS. 11A and 11B, the dielectric material 302 is etched back. In some embodiments, as shown in FIGS. 20A and 20B, the dielectric material 302 is removed.

The first portion 1102 of the sidewall 1004 of the conductive structure 1002 may include a portion of the second barrier layer 902 and a portion of the first barrier layer 602, as shown in FIGS. 11A and 11B. In some embodiments, the first portion 1102 of the sidewall 1004 of the conductive structure 1002 includes one or more of the first barrier layer 602, first conductive material 604, second barrier layer 902, and second conductive material 904. The etch back of the dielectric material 302 may be performed by any suitable method, such as dry etching, wet etching, or a combination thereof. In some embodiments, a selective dry etching process is utilized to perform the etch back. The selective dry etching process selectively removes a portion of the dielectric material 302, while the conductive structure 1002 is not removed.

As shown in FIGS. 11A and 11B, the dielectric material 302 surrounds a second portion 1104 of the sidewall 1004 of each conductive structure 1002. The second portion 1104 of the sidewall 1004 of the conductive structure 1002 may include a portion of the first barrier layer 602, as shown in FIGS. 11A and 11B. In some embodiments, the second portion 1104 of the sidewall 1004 of the conductive structure 1002 includes one or more of the first barrier layer 602 and first conductive material 604. In some embodiments, the first portion 1102 is a top portion of the sidewall 1004 of the conductive structure 1002, which is disposed on the second portion 1104, which is a bottom portion of the sidewall 1004 of the conductive structure 1002, as shown in FIGS. 11A and 11B.

Figure 12A:
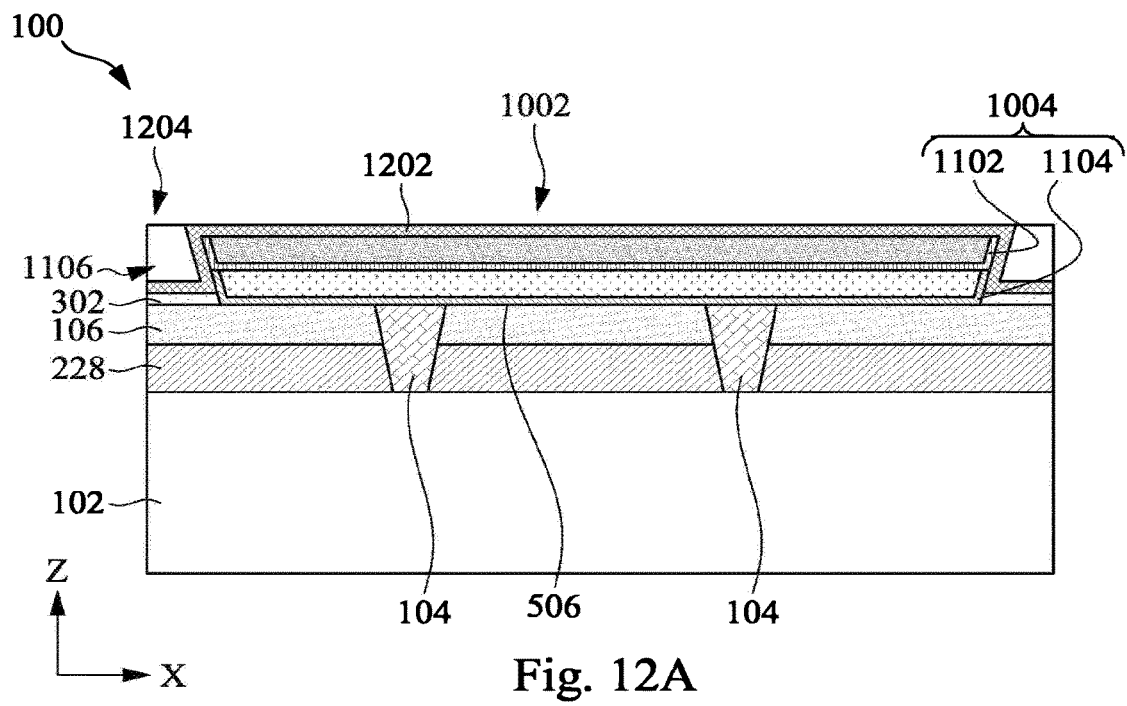
Figure 12B:
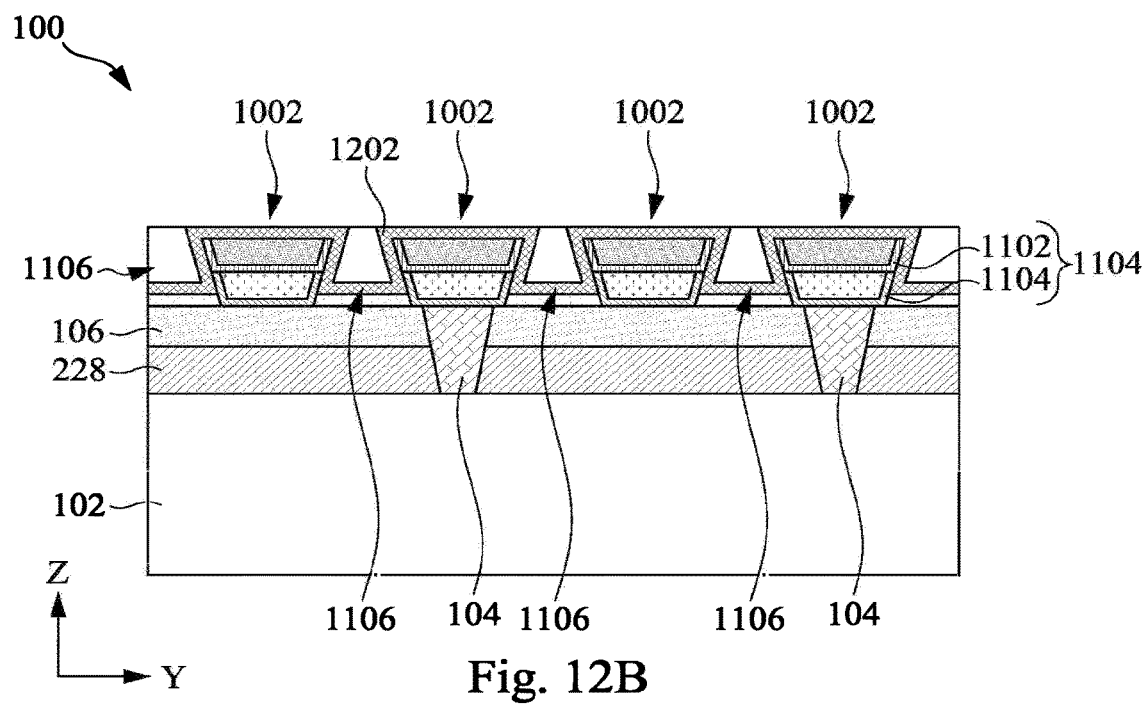

Next, as shown in FIGS. 12A and 12B, the spacer layer 1202 is formed on the dielectric material 302, the sidewall 1004 (the first barrier layer 602 and the second barrier layer 902), and the conductive structure 1002. The opening 1204 of the air gap 1106 may be defined by the spacer layer 1202. The spacer layer 1202 may include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. The spacer layer 1202 may include a different material as the dielectric material 302, and the spacer layer 1202 and the dielectric material 302 may have different etch selectivity. In some embodiments, the spacer layer 1202 may be conformally deposited in the air gaps 1106 and may have a thickness ranging from about 0.5 nm to about 6 nm. The thickness range of the spacer layer 1202 defines the opening 1204 of the air gap 1106. Thus, if the thickness of the spacer layer 1202 is less than about 0.5 nm, the opening 1204 may be too large, any material, such as a sealing material 1502 (FIGS. 15A and 15B), formed over the air gaps 1106 may fill the air gaps 1106. On the other hand, if the thickness of the spacer layer 1202 is greater than about 6 nm, the opening 1204 may be too small, and the air gap 1106 may be too small to provide improved isolation between neighboring conductive structures 1002. The spacer layer 1202 may be formed by any suitable method, such as ALD, CVD or PECVD.

Figure 13A:
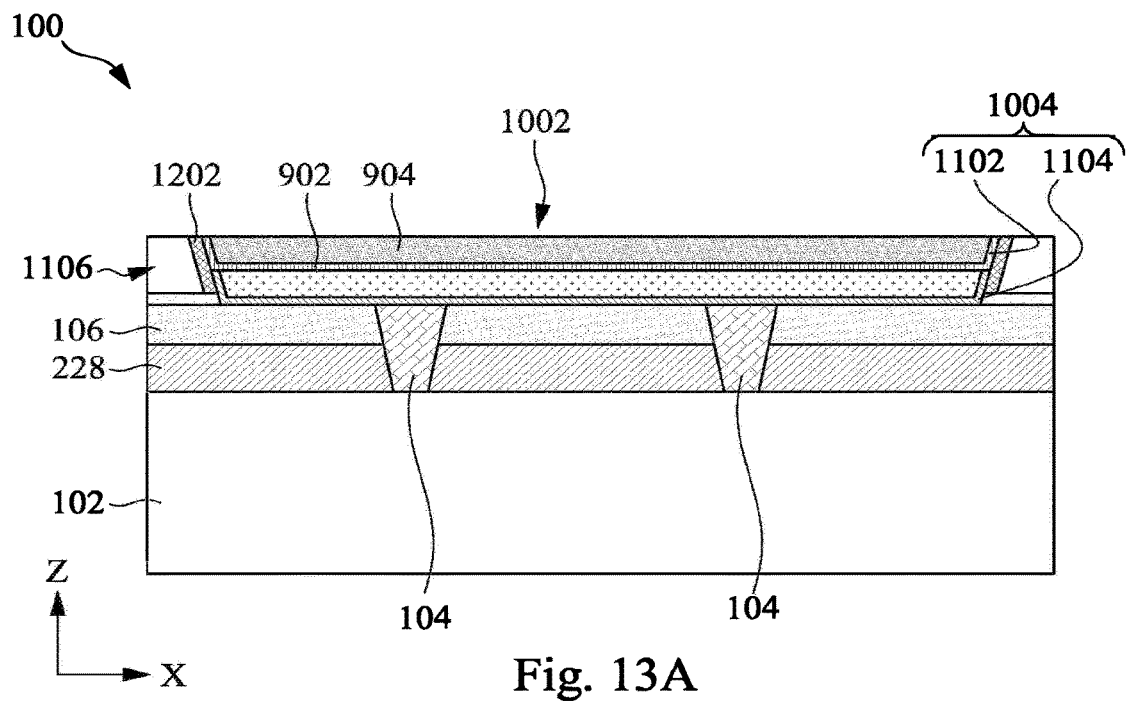
Figure 13B:
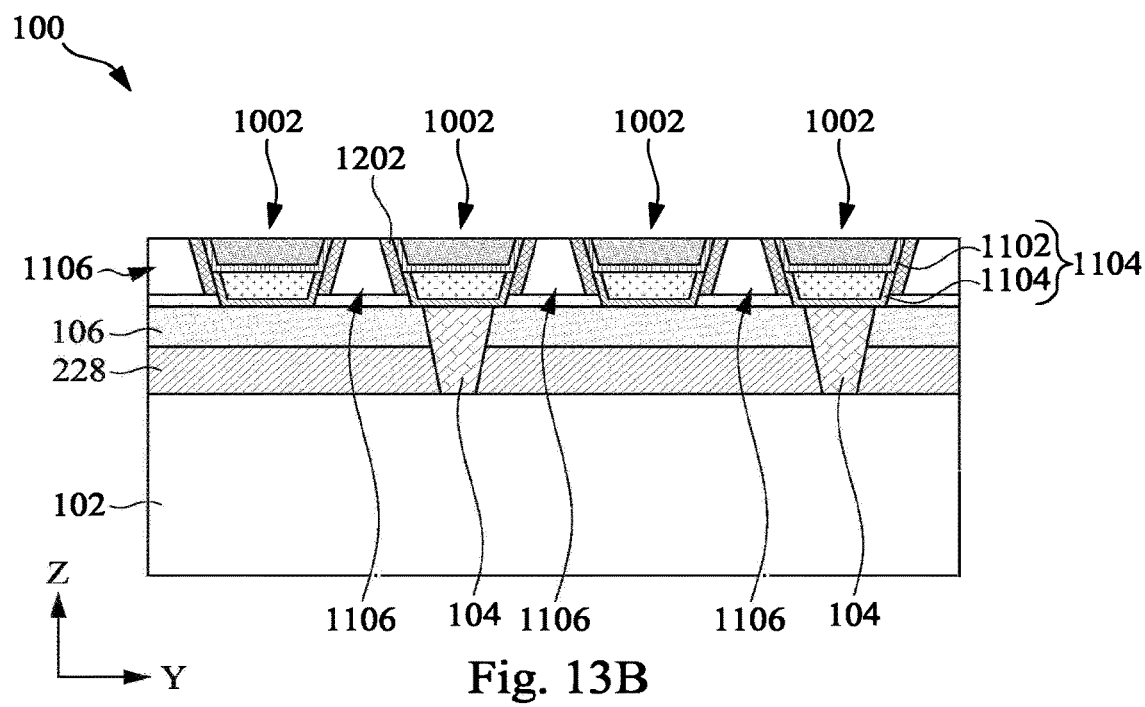

Next, as shown in FIGS. 13A and 13B, portions of the spacer layer 1202 are removed. In some embodiments, the portions of the spacer layer 1202 disposed on the dielectric material 302 and the conductive structure 1002 are removed, leaving the portion of the spacer layer 1202 adjacent and in contact with the sidewall 1004 of the conductive structure 1002. The spacer layer 1202 adjacent and in contact with the sidewall 1004 may have a height along the Z-axis ranging from about 0.5 nm to about 35 nm. The height of the spacer layer 1202 may be defined by the thicknesses of the dielectric material 302 before the etch back and after the etch back. The dielectric material 302 and the top of the conductive structure 1002 are exposed.

The removal of the portions of the spacer layer 1202 may be performed by any suitable method, such as an etching process. In one example, the etching process is an anisotropic selective dry etch process. The anisotropic selective dry etch removes the portions of the spacer layer 1202 disposed on horizontal surfaces but does not remove the portions disposed adjacent and in contact with the sidewalls 1004 of the conductive structure 1002. The anisotropic selective dry etch process selectively removes the portions of the spacer layer 1202, while the dielectric material 302 and the conductive structure 1002 are not removed.

Figure 14A:
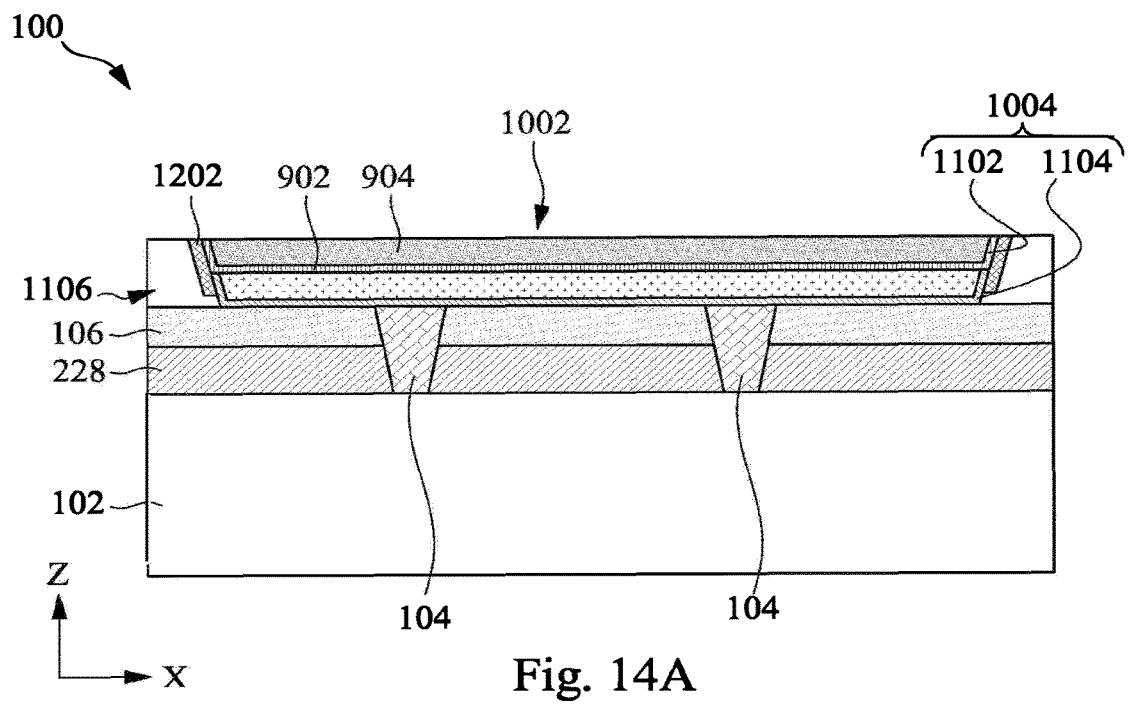
Figure 14B:
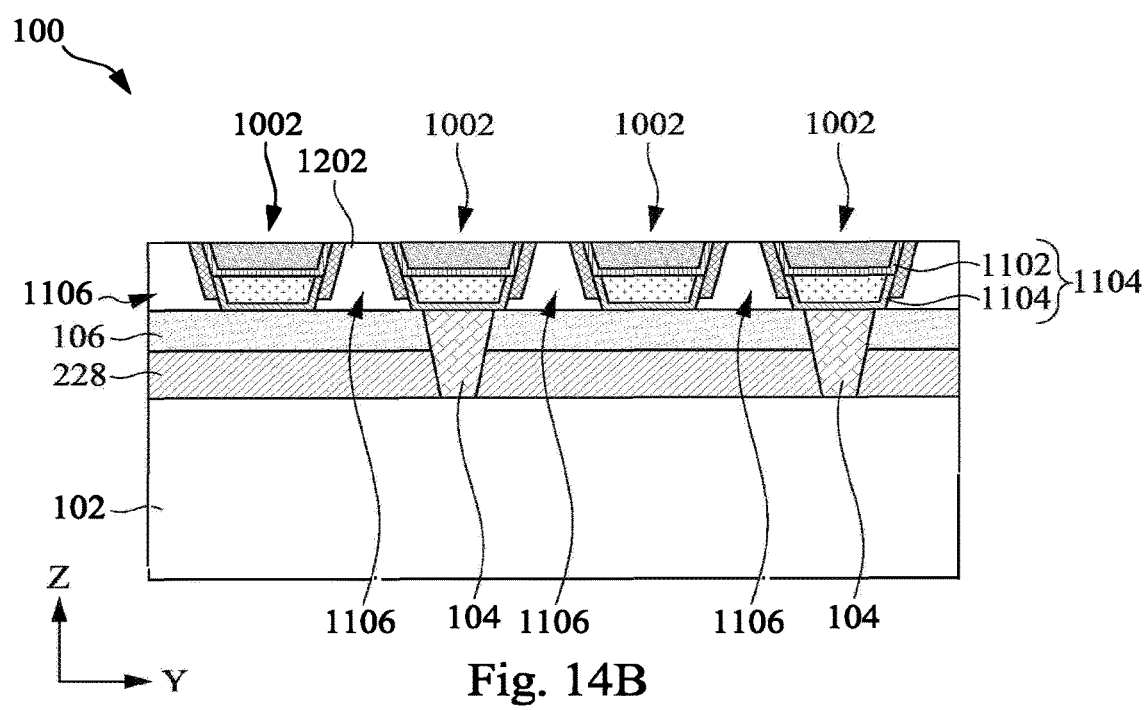

Next, as shown in FIGS. 14A and 14B, the dielectric material 302 surrounding the second portion 1104 of the sidewall 1004 of the conductive structure 1002 is removed to expose the second portion 1104 of the sidewall 1004 of the conductive structure 1002. The removal of the dielectric material 302 may be performed by any suitable method, such as an etching process. In one example, the etching process is an isotropic selective dry etch process that removes the dielectric material 302, while the spacer layer 1202 and the conductive structure 1002 are not removed. The spacer layer 1202 is in contact with the first portion 1102 of the sidewall 1004, while the second portion 1104 of the sidewall 1004 is exposed to the air gap 1106. The distance between the bottom of the spacer layer 1202 and the dielectric material 106 may range from about 0.5 nm to about 6 nm, and the distance is defined by the thickness of the dielectric material 302 previously surrounding the second portion 1104 of the sidewall 1004.

Figure 15A:
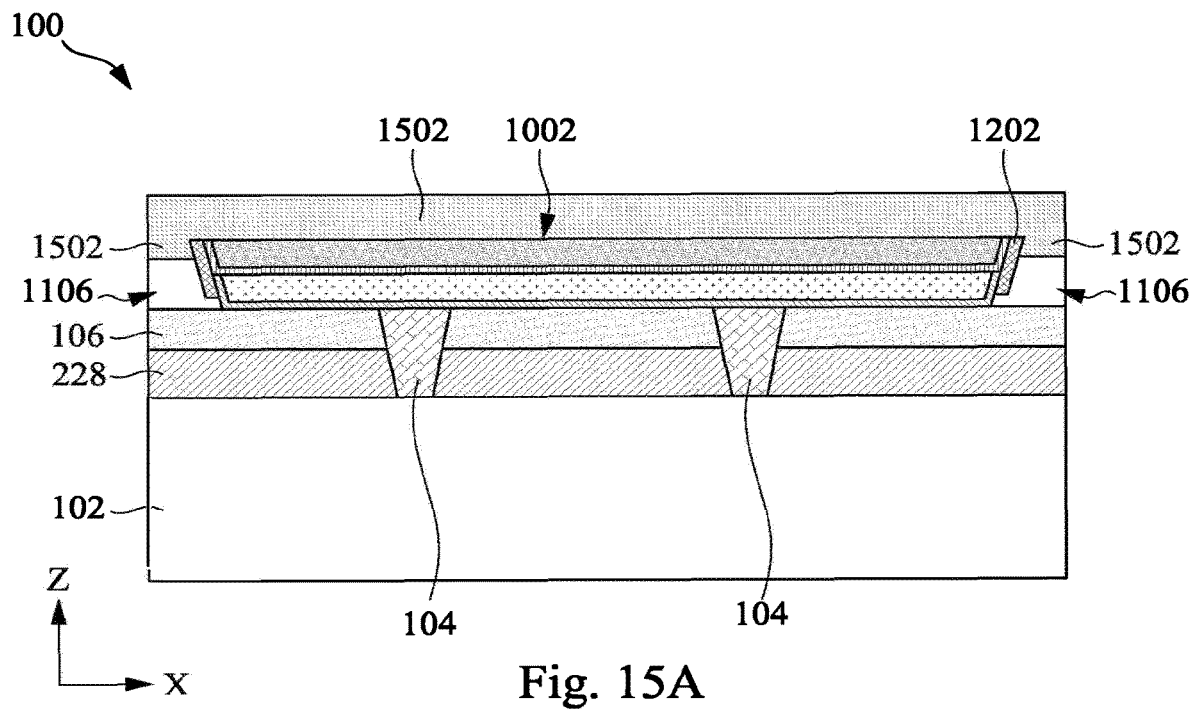
Figure 15B:
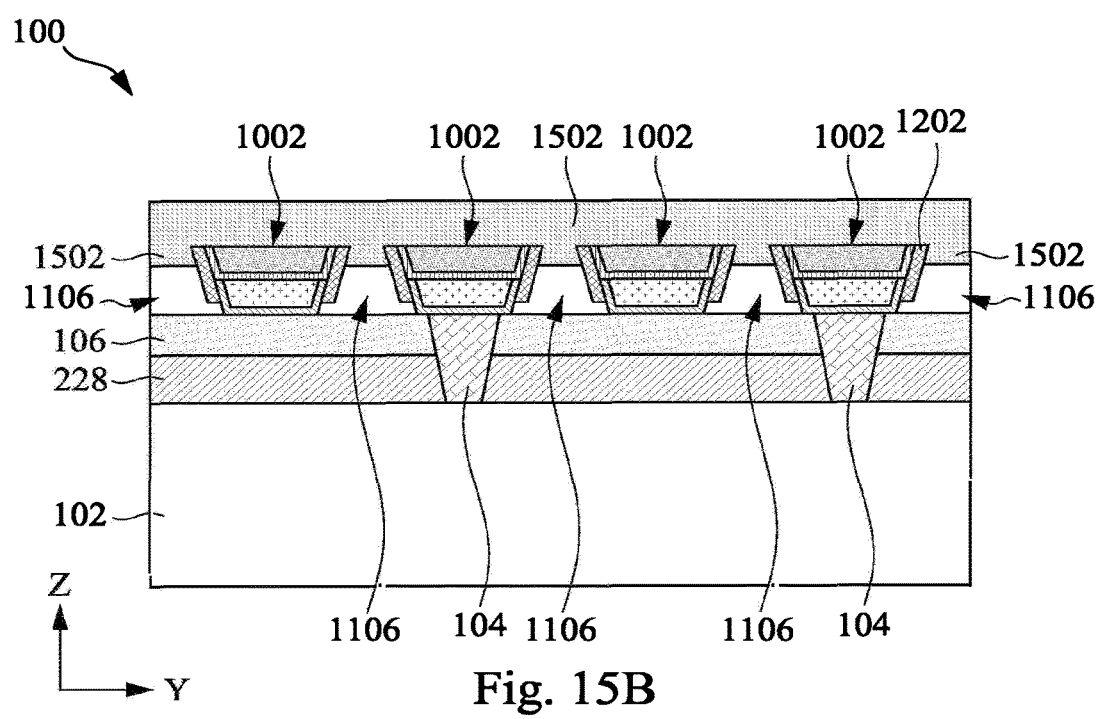

The sealing material 1502 is formed on the spacer layers 1202 and the conductive structures 1002, as shown in FIGS. 15A and 15B. The sealing material 1502 may also seal the air gaps 1106 by partially fill the air gaps 1106. The sealing material 1502 does not completely fill the air gaps 1106 due to the small opening 1204 (FIGS. 12A and 12B) of the air gap 1106. The sealing material 1502 may include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. The sealing material 1502 may include the same or different material as the spacer layer 1202. The sealing material 1502 may be formed by any suitable method, such as CVD.

Figure 16A:
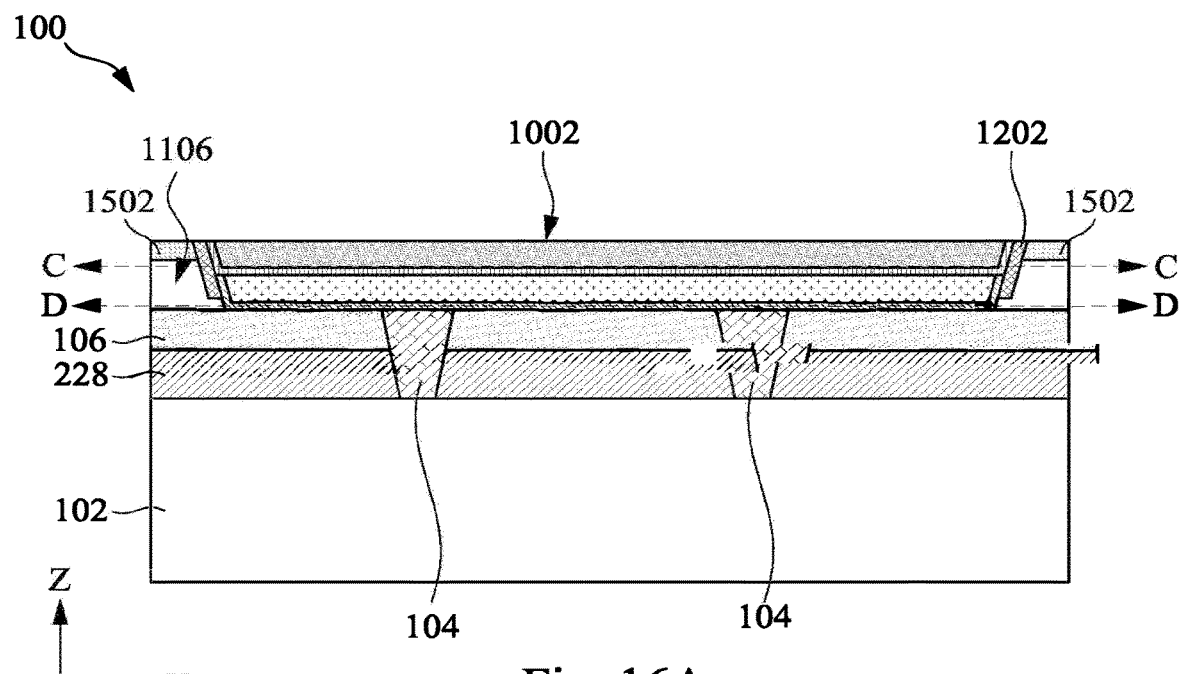
Figure 16B:
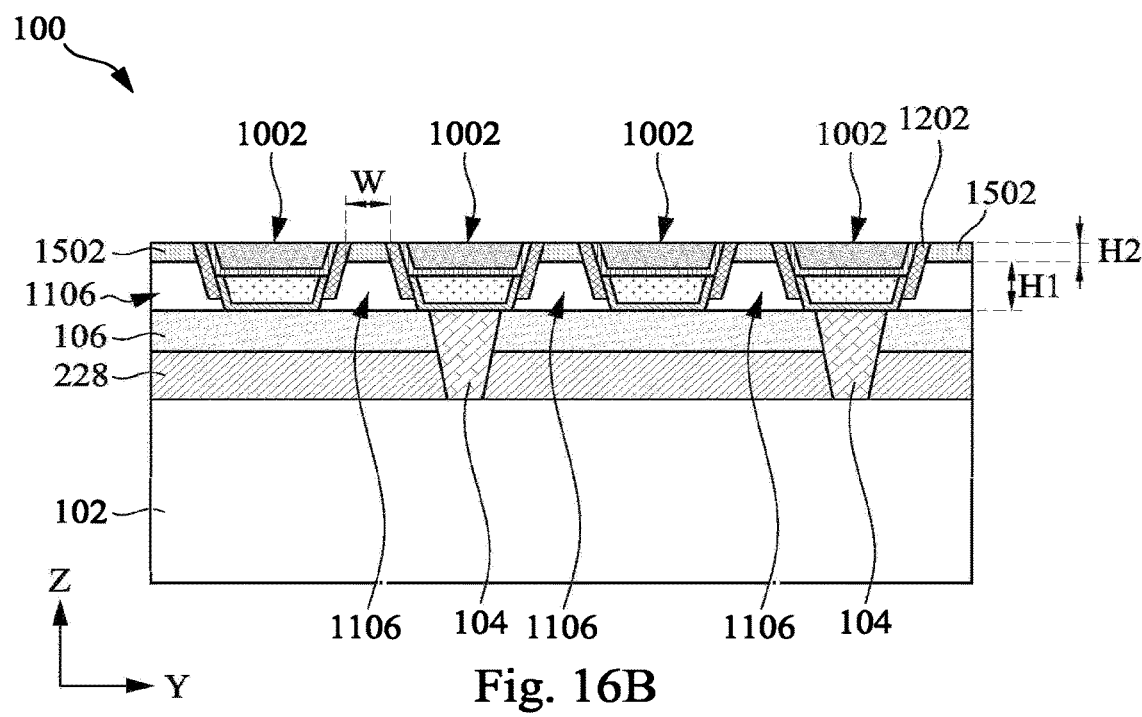

Next, as shown in FIGS. 16A and 16B, a planarization process is performed to expose the conductive structure 1002 and the spacer layer 1202. The planarization process may be any suitable process, such as a CMP process. The planarization process removes portions of the sealing material 1502 so the remaining sealing material 1502 disposed over the air gaps 1106 is substantially coplanar with the conductive structure 1002. As described above, the sealing material 1502 partially fills the air gap 1106. As a result, the air gap 1106 has a height H1 ranging from about 0.5 nm to about 30 nm, and the sealing material 1502 has a height H2 ranging from about 0.5 nm to about 20 nm. The height H1 may be defined by the thickness of the dielectric layer 302 before being etched back and by the height H2. The height H2 may be defined by the size of the opening 1204, which is defined by the thickness of the spacer layer 1202. The air gap 1106 may be defined by the dielectric material 106, the second portion 1104 of the sidewall 1004 of neighboring conductive structure 1002, the neighboring spacer layers 1202, and the sealing material 1502. In some embodiments, the second portion 1104 of the sidewall 1004 of a first conductive structure 1002 and a portion of the spacer layer 1202 disposed adjacent and in contact with the first portion 1102 of the sidewall of the first conductive structure 1002 are exposed to a first air gap 1106. The second portion 1104 of the sidewall 1004 of a second conductive structure 1002 adjacent the first conductive structure 1002 and a portion of the spacer layer 1202 disposed adjacent and in contact with the first portion 1102 of the sidewall of the second conductive structure 1002 are exposed to the first air gap 1106.

In some embodiments, a width W of the air gap 1106 along the Y-axis varies based on the height H1 of the air gap 1106. In one aspect, the width W decreases in the direction of the height H1 moving away from the dielectric material 106. For example, the width W at the top of the air gap is W1 (FIG. 17A), which may range from about 3 nm to about 16 nm. The range of the width W1 may be defined by the height H2 of the sealing material. The width W at the bottom of the air gap 1106 is W2 (FIG. 17B), which may range from about 3 nm to about 30 nm. The width W2 at the bottom of the air gap 1106 may be defined by the arrangement of the conductive structures 1002, which in turn may be defined by the arrangements of the conductive features 104. The width W may be generally defined by the arrangements of the conductive structures 1002. Thus, the lower limit of 3 nm may be defined by the pitch of conductive structures 1002, not feasible to go any lower. On the other hand, if the distance between conductive structures 1002 are greater than 30 nm, capacitive coupling between the conductive structures 1002 may be low, rendering the air gap 1106 formed therebetween a result of increasing manufacturing cost without significant advantage.

Figure 17A:
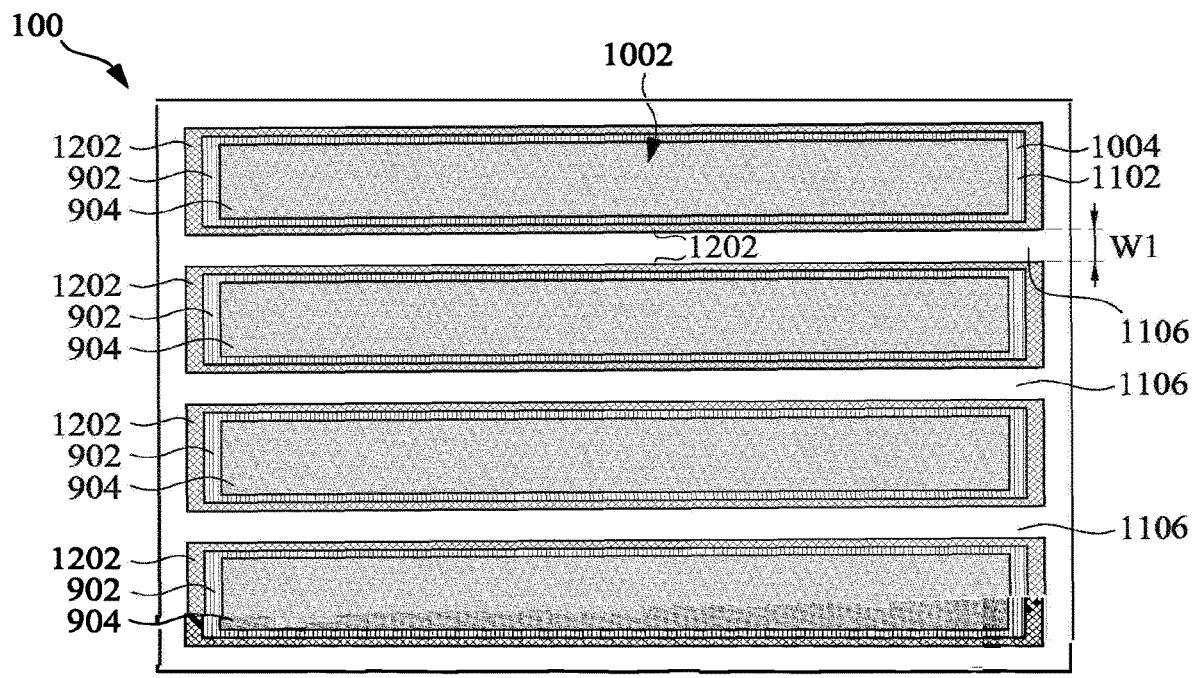

FIG. 17A is a top view of the semiconductor device structure 100 at the manufacturing stage taken along line C-C as shown in FIG. 16A, in accordance with some embodiments. As shown in FIG. 17A, the air gap 1106 surrounds the spacer layer 1202, which surrounds the first portion 1102 of the sidewall 1004 of the conductive structure 1002. The air gap 1106 is a continuous air gap that surrounds multiple surfaces, such as 4 surfaces of the sidewall 1004 of the conductive structure 1002. The width W1 of the air gap 1106 between neighboring spacer layers 1202 may range from about 3 nm to about 16 nm. The air gaps 1106 may replace the dielectric material 302 (FIGS. 10A and 10B). In other words, because the dielectric material 302 may be the second ILD, the second ILD may be replaced by the air gaps 1106. The air gap 1106, which has a lower k value compared to the materials of the spacer layer 1202 and the dielectric material 302, is formed to isolate conductive structures 1002, leading to reduced capacitive coupling between neighboring conductive structures 1002.

Figure 17B:
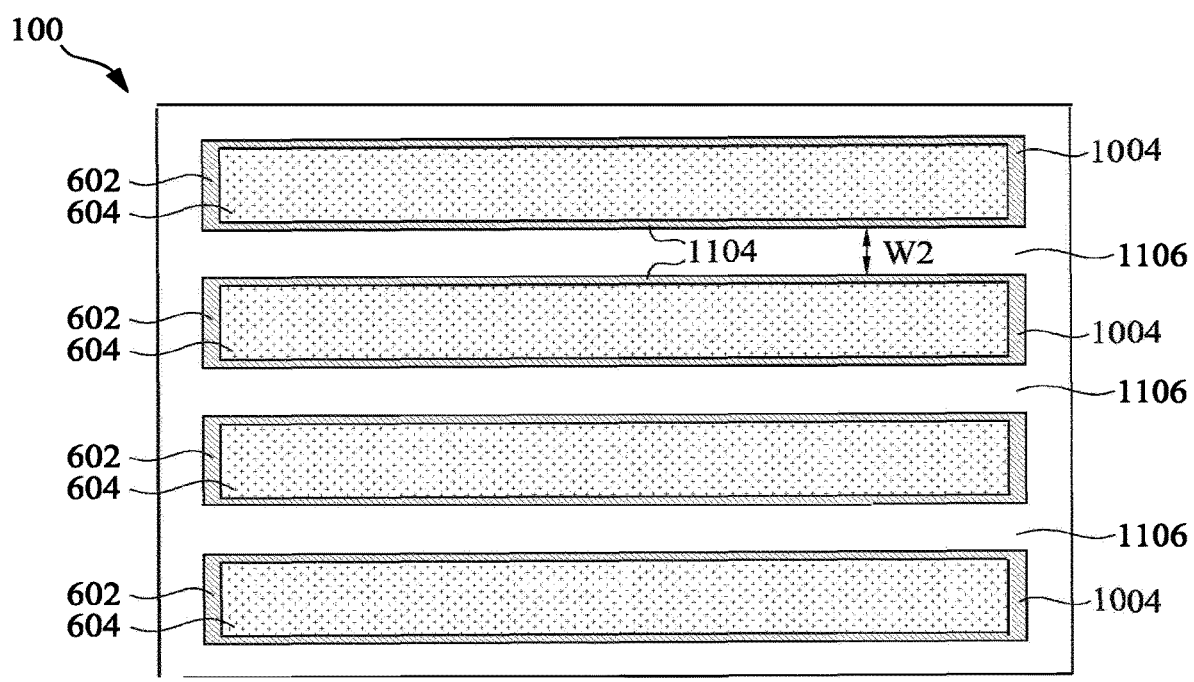

FIG. 17B is a top view of the semiconductor device structure 100 at the manufacturing stage taken along line D-D as shown in FIG. 16A, in accordance with some embodiments. As shown in FIG. 17B, the air gap 1106 surrounds the second portion 1104 of the sidewall 1004 of the conductive structure 1002. The width W2 of the air gap 1106 between neighboring second portions 1104 of the sidewalls 1004 may range from about 3 nm to about 30 nm. In some embodiments, the width W2 is greater than the width W1.

Figure 18A:
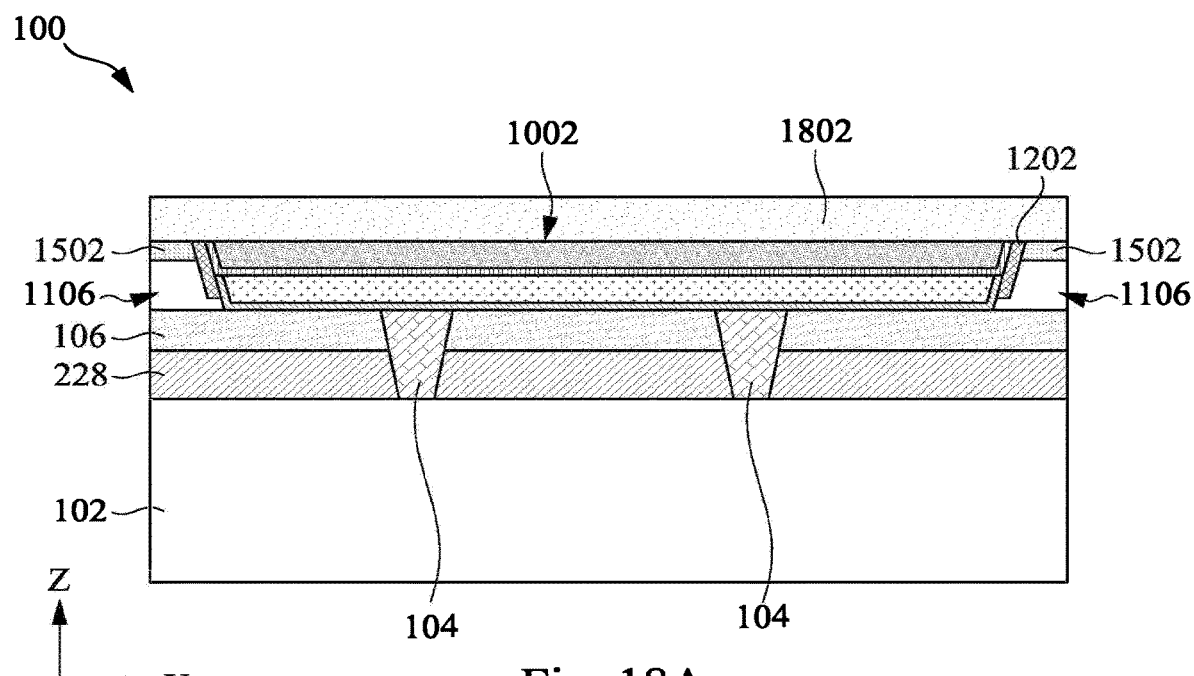
Figure 18B:
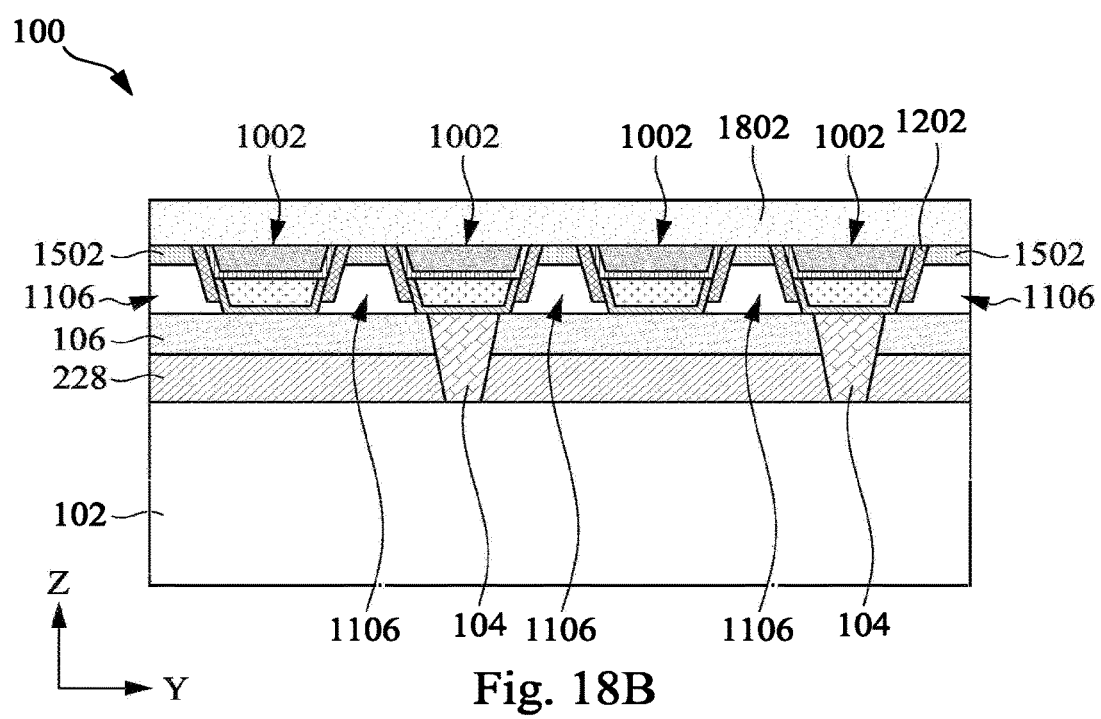

A dielectric material 1802 is formed on the sealing materials 1502, the spacer layers 1202, and the conductive structures 1002, as shown in FIGS. 18A and 18B. The dielectric material 1802 may be a third ILD. The dielectric material 1802 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The dielectric material 1802 may include the same or different material as the dielectric material 302. In some embodiments, the sealing material 1502 includes the same material as the dielectric material 1802, and the sealing material 1502 may function as the third ILD. In such embodiments, the planarization process described in FIGS. 16A and 16B and the deposition of the dielectric material 1802 described in FIGS. 18A and 18B are skipped. Conductive structures (not shown) may be formed in the dielectric material 1802 to connect to the conductive structures 1002. In some embodiments, the dielectric material 1802 may be replaced by air gaps based on the processes described above.

Figure 19A:
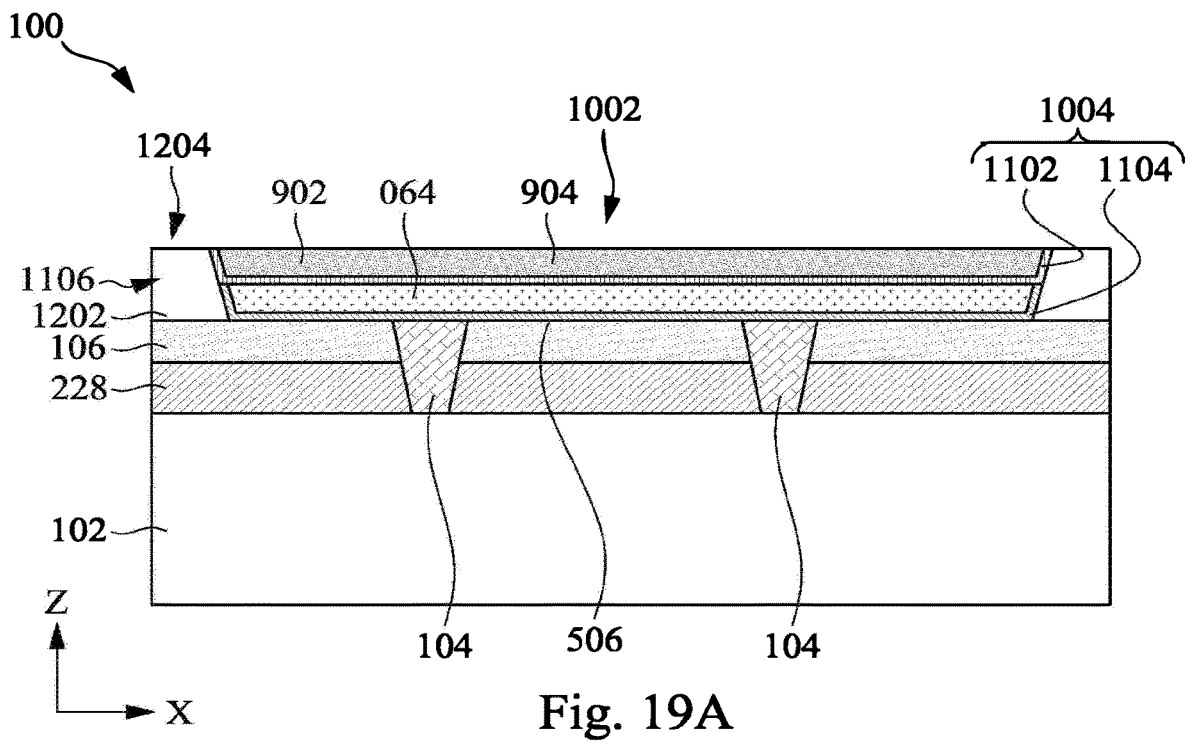
Figure 19B:
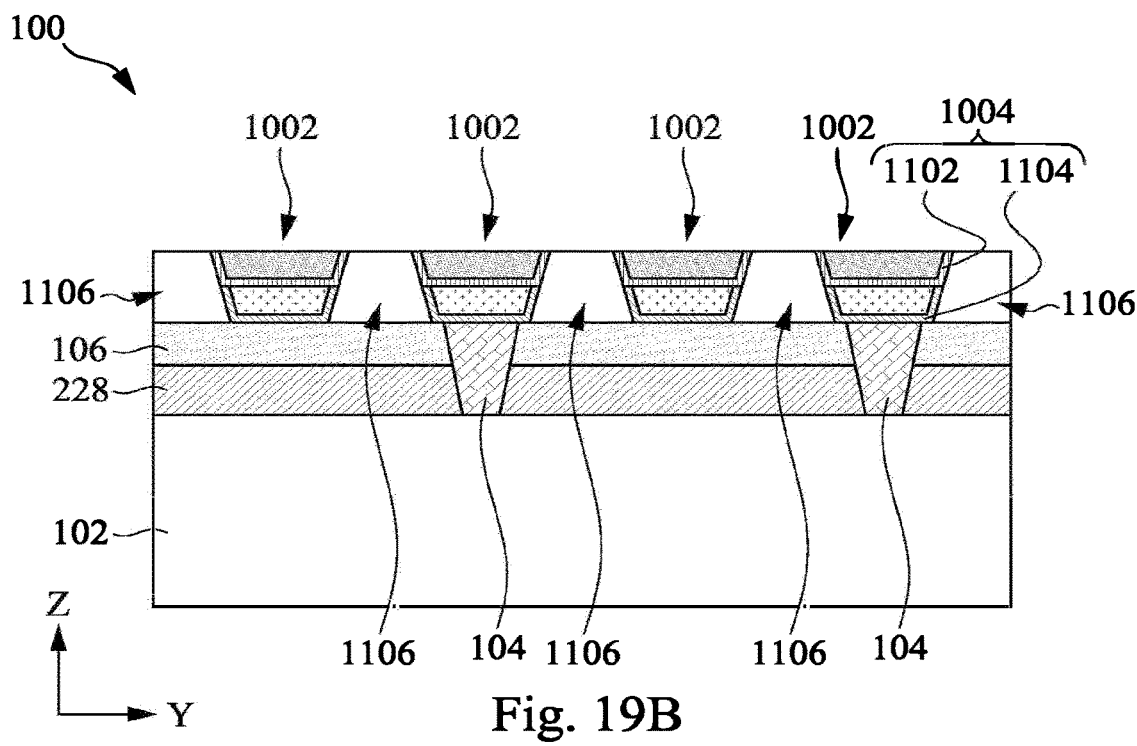

FIGS. 19A and 19B are cross-sectional side views of the semiconductor device structure 100 at the manufacturing stage right after FIGS. 10A and 10B, in accordance with some embodiments. As shown in FIGS. 19A and 19B, instead of etching back the dielectric material 302 as shown in FIGS. 11A and 11B, the dielectric material 302 is removed. Thus, both first portion 1102 and second portion 1104 of the sidewall 1004 of the conductive structure 1002 are exposed. The spacer layer 1202 is formed on the dielectric material 106, the first portion 1102, the second portion 1104, and the conductive structure 1002, as shown in FIGS.

Figure 21A:
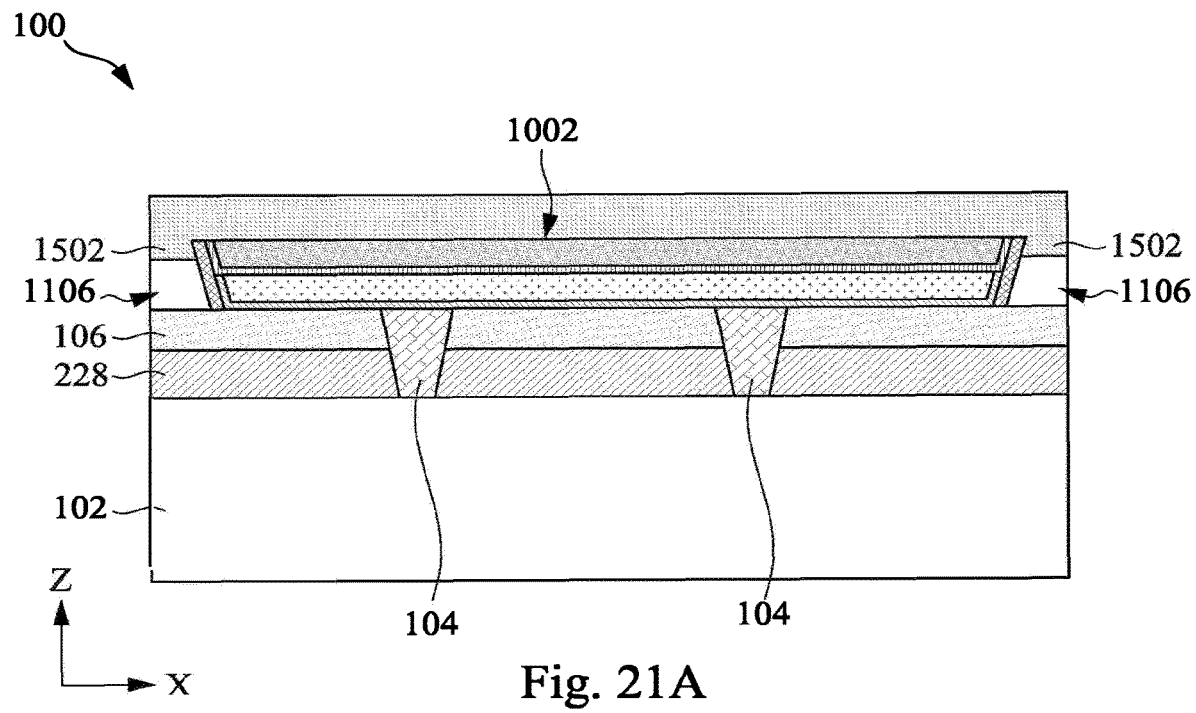
Figure 21B:
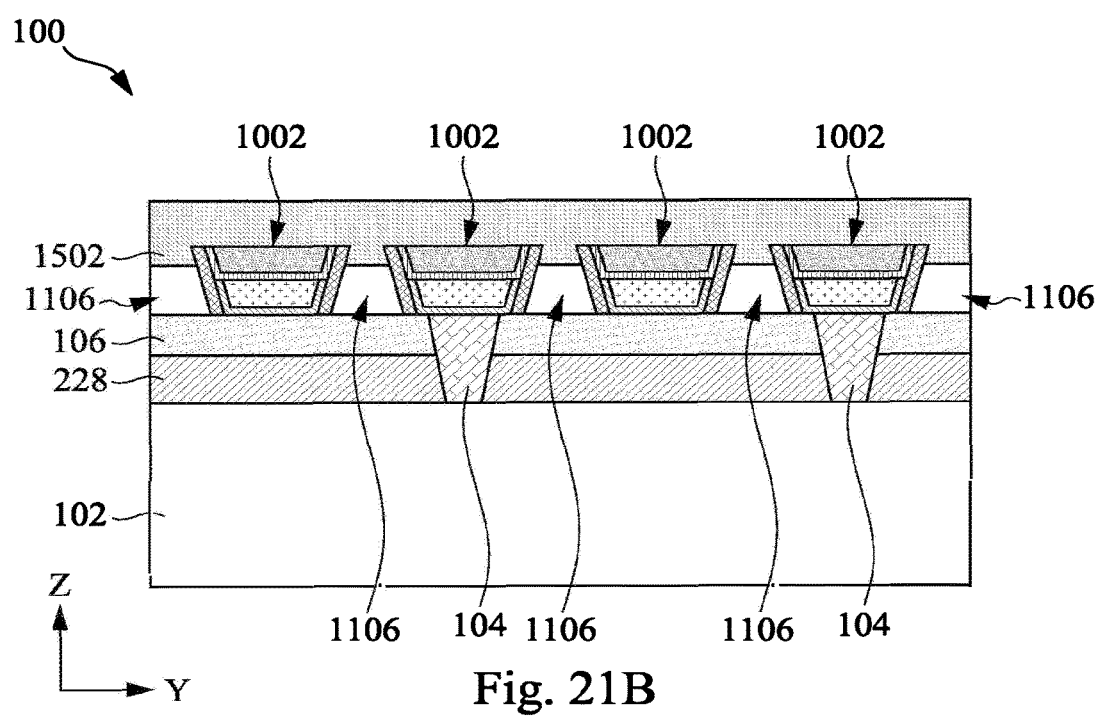

20A and 20B. Next, similar to the processes described in FIGS. 13A, 13B, 15A, and 15B, portions of the spacer layer 1202 are removed and the sealing material 1502 is formed on the conductive structures 1002 and partially fill the air gaps 1106, as shown in FIGS. 21A and 21B. The spacer layer 1202 disposed adjacent and in contact with the sidewall 1004 extends to and in contact with the dielectric material 106, as shown in FIGS. 21A and 21B. The spacer layer 1202 may surround the sidewall 1004 of the conductive structure 1002, and the air gap 1106 surrounds the spacer layer 1202. In some embodiments, the air gap 1106 may be defined by the dielectric material 106, the neighboring spacer layers 1202, and the sealing material 1502. As shown in FIG. 22B, the width W2 at the bottom of the air gap 1106 may range from about 2 nm to about 18 nm.

Figure 22A:
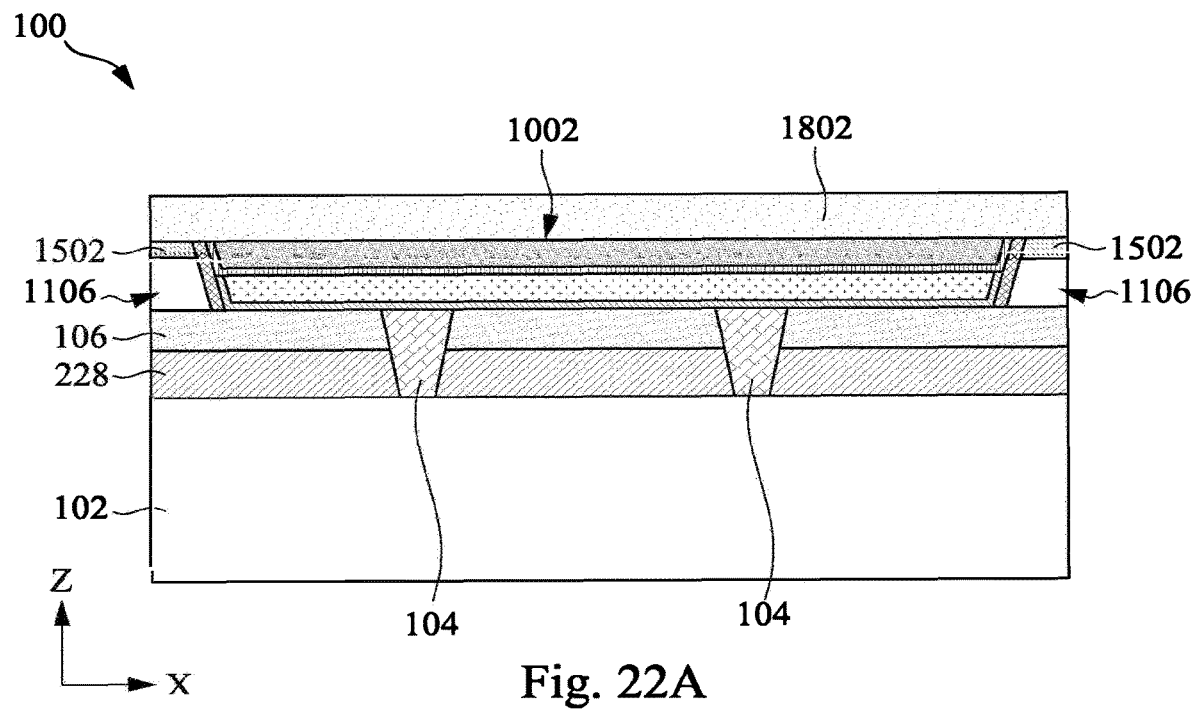
Figure 22B:
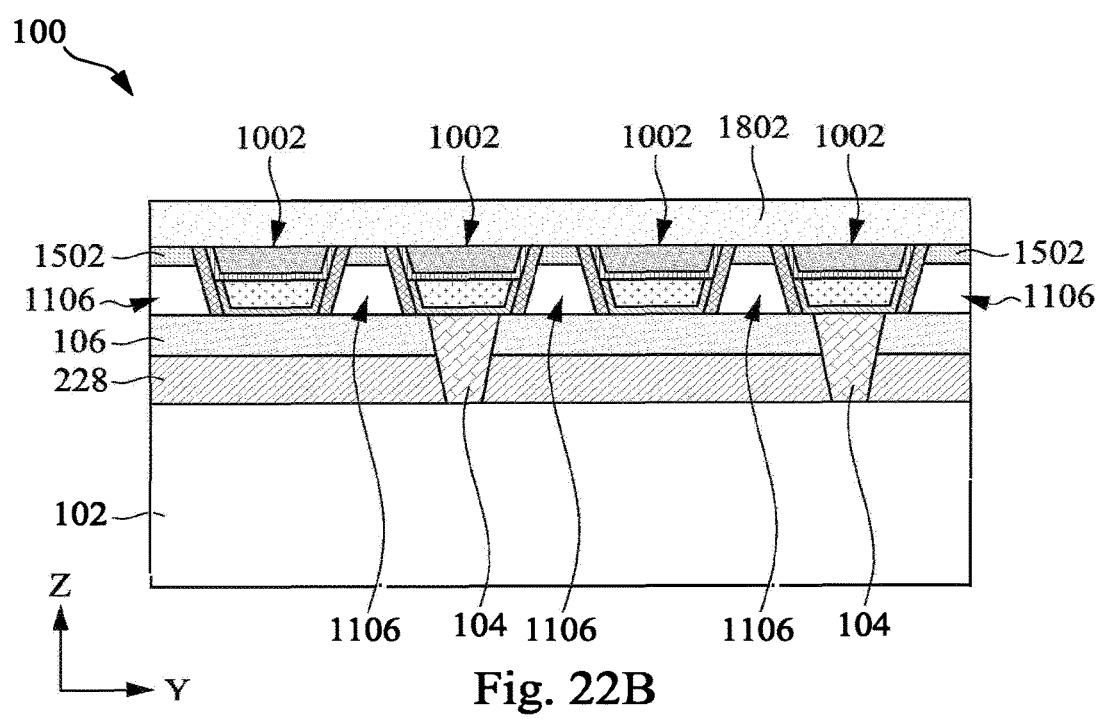

Next, as shown in FIGS. 22A and 22B, portions of the sealing material 1502 are removed, and the dielectric material 1802 is formed on the sealing materials 1502 and the conductive structures 1002, similar to the processes described in FIGS. 16A, 16B, 18A, and 18B.

The present disclosure provides a semiconductor device structure 100 including a device 202, a conductive structure 1002 disposed above the device 202, a spacer layer 1202 disposed on at least a portion of the sidewall 1004 of the conductive structure 1002, and an air gap 1106 surrounding the spacer layer 1202. Some embodiments may achieve advantages. For example, the spacer layer 1202 defines the opening 1204 of the air gap 1106, so the air gap 1106 can provide improved isolation between neighboring conductive structures 1002 while preventing materials from filling the air gaps 1106. The air gap 1106 has a lower k value compared to the spacer layer 1202, which reduces capacitive coupling between neighboring conductive structures 1002.

An embodiment is a semiconductor device structure. The semiconductor device structure includes a device, a first conductive structure disposed over the device, and the first conductive structure includes a first sidewall having a first portion and a second portion. The semiconductor device structure further includes a first spacer layer disposed on the first portion of the first sidewall of the first conductive structure, a second conductive structure disposed adjacent the first conductive structure, and the second conductive structure includes a second sidewall having a third portion and a fourth portion. The semiconductor device structure further includes a second spacer layer disposed on the third portion of the second sidewall of the second conductive structure, and an air gap is formed between the first conductive structure and the second conductive structure. The second portion of the first sidewall of the first conductive structure, the first spacer layer, the fourth portion of the second sidewall of the second conductive structure, and the second spacer layer are exposed to the air gap.

Another embodiment is a semiconductor device structure. The semiconductor device structure includes a device, a first dielectric material disposed over the device, a first conductive structure disposed over the first dielectric material, and the first conductive structure includes a first sidewall. The semiconductor structure device further includes a first spacer layer disposed on the first sidewall of the first conductive structure, a second conductive structure disposed adjacent the first conductive structure, and the second conductive structure includes a second sidewall. The semiconductor device structure further includes a second spacer layer disposed on the second sidewall of the second conductive structure, and a sealing material disposed between the first spacer layer and the second spacer layer. An air gap is defined by the first dielectric material, the first spacer layer, the second spacer layer, and the sealing material.

A further embodiment is a method. The method includes forming a device over a substrate, forming a dielectric material over the device, forming a first opening and a second opening in the dielectric material, and forming a first conductive structure in the first opening and a second conductive structure in the second opening. The first conductive structure includes a first sidewall having a first portion and a second portion, and the second conductive structure includes a second sidewall having a third portion and a fourth portion. The method further includes removing at least a portion of the dielectric material between the first conductive structure and the second conductive structure, and the first portion of the first sidewall of the first conductive structure and the third portion of the second sidewall of the second conductive structure are exposed. The method further includes forming a first spacer layer on the first portion of the first sidewall of the first conductive structure and a second spacer layer on the third portion of the second sidewall of the second conductive structure, and forming a sealing material between the first and second conductive structures. An air gap is formed between the first conductive structure and the second conductive structure, and the sealing material, the first spacer layer, and the second spacer layer are exposed to the air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    forming a device over a substrate;
    forming a dielectric material over the device;
    forming a first opening and a second opening in the dielectric material;
    forming a first conductive structure in the first opening and a second conductive structure in the second opening, wherein the first conductive structure comprises a first sidewall having a first portion and a second portion, and the second conductive structure comprises a second sidewall having a third portion and a fourth portion;
    removing at least a portion of the dielectric material between the first conductive structure and the second conductive structure, wherein the first portion of the first sidewall of the first conductive structure and the third portion of the second sidewall of the second conductive structure are exposed;
    forming a first spacer layer on the first portion of the first sidewall of the first conductive structure and a second spacer layer on the third portion of the second sidewall of the second conductive structure; and
    forming a sealing material between the first and second conductive structures, wherein an air gap is formed between the first conductive structure and the second conductive structure, wherein the sealing material, the first spacer layer, and the second spacer layer are exposed to the air gap.

2. The method of claim 1, wherein the removing at least the portion of the dielectric material comprises leaving a remaining portion of the dielectric material in contact with the second portion of the first sidewall of the first conductive structure and the fourth portion of the second sidewall of the second conductive structure, and wherein the first spacer layer and the second spacer layer are formed on the remaining portion of the dielectric material.

3. The method of claim 2, further comprising removing the remaining portion of the dielectric material after forming the first spacer layer and the second spacer layer.

4. The method of claim 1, wherein the removing of at least the portion of the dielectric material comprises removing the dielectric material disposed between the first conductive structure and the second conductive structure, wherein the second portion of the first sidewall of the first conductive structure and the fourth portion of the second sidewall of the second conductive structure are exposed.

5. The method of claim 4, wherein the first spacer layer is formed on the second portion of the first sidewall of the first conductive structure, and the second spacer layer is formed on the fourth portion of the second sidewall of the second conductive structure.

6. A method for forming a semiconductor device structure, comprising:
    forming a first dielectric material on a second dielectric material over a substrate;
    forming a first opening and a second opening in the first dielectric material;
    forming a first conductive structure in the first opening and a second conductive structure in the second opening;
    removing the first dielectric material between the first conductive structure and the second conductive structure to expose a portion of the second dielectric material;
    forming a spacer layer on the exposed portion of the second dielectric material and on the first and second conductive structures, wherein the spacer layer comprises a first portion disposed on the exposed portion of the second dielectric material, a second portion disposed on the first and second conductive structures, and a third portion disposed on sidewalls of the first and second conductive structures;
    removing the first and second portions of the spacer layer; and
    forming a sealing material between the first and second conductive structures, wherein an air gap is formed between the first conductive structure and the second conductive structure, wherein the sealing material, the spacer layer, and the second dielectric material are exposed to the air gap.

7. The method of claim 6, wherein the forming the first conductive structure comprises:
    forming a first barrier in the first opening; and
    forming a first conductive material on the first barrier.

8. The method of claim 7, wherein the forming the first conductive structure further comprises:
    removing a portion of the first conductive material and a portion of the first barrier layer;
    forming a second barrier layer on the first barrier layer and the first conductive material; and
    forming a second conductive material on the second barrier layer.

9. The method of claim 8, wherein the first conductive material comprises TiN and the second conductive material comprises Cu.

10. The method of claim 8, further comprising performing a planarization process, wherein the second conductive material is substantially coplanar with the first dielectric material.

11. The method of claim 8, wherein the forming the sealing material comprises forming the sealing material on the second conductive material.

12. The method of claim 11, further comprising removing a portion of the sealing material formed on the second conductive material, wherein the sealing material is substantially coplanar with the first and second conductive structures.

13. The method of claim 12, further comprising forming a third dielectric material on the sealing material, the third portion of the spacer layer, and the first and second conductive structures.

14. A method for forming a semiconductor device structure, comprising:
    forming a first dielectric material on a second dielectric material over a substrate;
    forming a first opening and a second opening in the first dielectric material;
    forming a first conductive structure in the first opening and a second conductive structure in the second opening;
    removing a first portion of the first dielectric material between the first conductive structure and the second conductive structure to expose a first portion of a sidewall of the first conductive structure and a first portion of a sidewall of the second conductive structure, wherein a second portion of the first dielectric material remains in contact with a second portion of the sidewall of the first conductive structure and a second portion of the sidewall of the second conductive structure;
    forming a spacer layer on second portion of the first dielectric material, the exposed first portion of the sidewall of the first conductive structure, the exposed first portion of the sidewall of the second conductive structure, and tops of the first and second conductive structures;
    removing the portions of the spacer layer disposed on the second portion of the first dielectric material and on the tops of the first and second conductive structures; and
    forming a sealing material between the first and second conductive structures, wherein an air gap is formed between the first conductive structure and the second conductive structure, wherein the sealing material and the spacer layer are exposed to the air gap.

15. The method of claim 14, further comprising removing the second portion of the first dielectric material to expose a portion of the second dielectric material after the removing the portions of the spacer layer and before the forming the sealing material.

16. The method of claim 15, wherein exposed portion of the second dielectric material is exposed to the air gap.

17. The method of claim 14, wherein the air gap surrounds the first and second conductive structures.

18. The method of claim 14, wherein the forming the first conductive structure comprises:
    forming a first barrier in the first opening; and
    forming a first conductive material on the first barrier.

19. The method of claim 18, wherein the forming the first conductive structure further comprises:

removing a portion of the first conductive material and a portion of the first barrier layer;

forming a second barrier layer on the first barrier layer and the first conductive material; and forming a second conductive material on the second barrier layer.

20. The method of claim 19, further comprising performing a planarization process, wherein the second conductive material is substantially coplanar with the first dielectric material.

* * * * *